(12) United States Patent
El-Ibiary

(10) Patent No.: US 7,184,902 B2
(45) Date of Patent: Feb. 27, 2007

(54) MOTOR PARAMETER ESTIMATION METHOD AND APPARATUS

(75) Inventor: Yehia El-Ibiary, Simpsonville, SC (US)

(73) Assignee: Reliance Electric Technologies, LLC, Mayfield Heights, OH (US)

(*) Notice: Subject to any disclaimer, the term of this patent is extended or adjusted under 35 U.S.C. 154(b) by 93 days.

(21) Appl. No.: 10/675,104

(22) Filed: Sep. 30, 2003

(65) Prior Publication Data

US 2005/0071095 A1 Mar. 31, 2005

(51) Int. Cl.
*G01R 21/00* (2006.01)
*G01R 21/06* (2006.01)

(52) U.S. Cl. .................................................. 702/60

(58) Field of Classification Search ............... 702/57, 702/60, 64, 65
See application file for complete search history.

(56) References Cited

U.S. PATENT DOCUMENTS

| | | | |
|---|---|---|---|
| 5,345,158 A | 9/1994 | Kliman et al. | 318/434 |
| 5,687,094 A * | 11/1997 | Kagawa et al. | 716/5 |
| 6,042,265 A | 3/2000 | Kliman et al. | 374/152 |
| 6,530,821 B2 * | 3/2003 | Legatt et al. | 451/8 |
| 6,862,538 B2 * | 3/2005 | El-Ibiary | 702/38 |
| 2002/0053894 A1 | 5/2002 | Shishkin et al. | 318/727 |

OTHER PUBLICATIONS

Fundamentals of Electric Drives, Mohamed A. El-Sharkawi, University of Washington, 2000.

* cited by examiner

*Primary Examiner*—Michael Nghiem
(74) *Attorney, Agent, or Firm*—Patrick S. Yoder; Alexander M. Gerasimow

(57) ABSTRACT

A system and method for establishing estimated values of electrical parameters of a motor. The electrical parameters may be established from motor databases, measured input electrical data, measured output data, and various estimations to account for unknown motor parameters. Compensations also may be provided for stator resistance, cable resistance, and other motor parameters. Based on the foregoing data, the system and method also may be used to estimate motor operating parameters, such as torque, efficiency, output power, output speed, and other performance criteria of the motor. The system and method also may establish energy and monetary comparison data between the motor and at least one alternative motor.

32 Claims, 9 Drawing Sheets

MOTOR PARAMETER ESTIMATION METHOD AND APPARATUS

BACKGROUND OF THE INVENTION

The present technique relates generally to the field of electric motors. More particularly, the invention relates to a novel technique for estimating unknown parameters of an induction motor based on motor data obtained at one or more operating points or a no-load operating point.

A wide variety of induction motors are available and are currently in use throughout a range of industrial applications. In general, such motors include a stator provided in a motor housing and a rotor surrounded at least partially by the stator and supported for rotation within the housing. The stator and rotor may be mechanically and electrically configured in a variety of manners depending upon a number of factors, including: the application, the power available to drive the motor, and so forth. In general, however, electric power is applied to the stator to produce a rotating magnetic field to drive the rotor in rotation. Mechanical power is transmitted from the motor via an output shaft coupled to the rotor.

Motor operating parameters, such as output torque or efficiency, may only be determined with the motor in operation. Knowledge of these motor operating parameters can be important for a number of reasons. However, the devices used to measure motor operating parameters may interfere with the operation of the motor or may be relatively expensive. In addition, it may be difficult to measure the operating parameter. For example, it may be desirable to maintain the temperature of the rotor below a specific temperature. However, it is extremely difficult to measure the rotor temperature. In addition, it may be desirable to establish the torque and/or efficiency of a given motor to ensure that the proper motor is used in a given application. However, a typical torque measuring device requires the motor to be disconnected from its load each time the torque measurement is desired, interfering significantly with the operation of the motor. Previous attempts to develop a device to estimate motor operating parameters, such as torque and efficiency, have relied on motor nameplate data. However, these attempts have not yielded accurate results. Alternatively, a customer may not have the values of the motor electrical parameters that might be used to develop an estimate of various motor operating parameters.

A need exists for a technique for obtaining electric motor operating parameter data that is less expensive than conventional methods and which minimizes the disruption to the operation of a system incorporating the electric motor.

SUMMARY OF THE INVENTION

The present technique provides a novel system and method for establishing estimated values of electrical parameters of a motor. The electrical parameters may be established from motor databases, measured input electrical data, measured output data, and various estimations to account for unknown motor parameters. Compensations also may be provided for stator resistance, cable resistance, and other motor parameters. Based on the foregoing data, the system and method also may be used to estimate motor operating parameters, such as torque, efficiency, output power, output speed, and other performance criteria of the motor. The system and method also may establish energy and monetary comparison data between the motor and at least one alternative motor.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
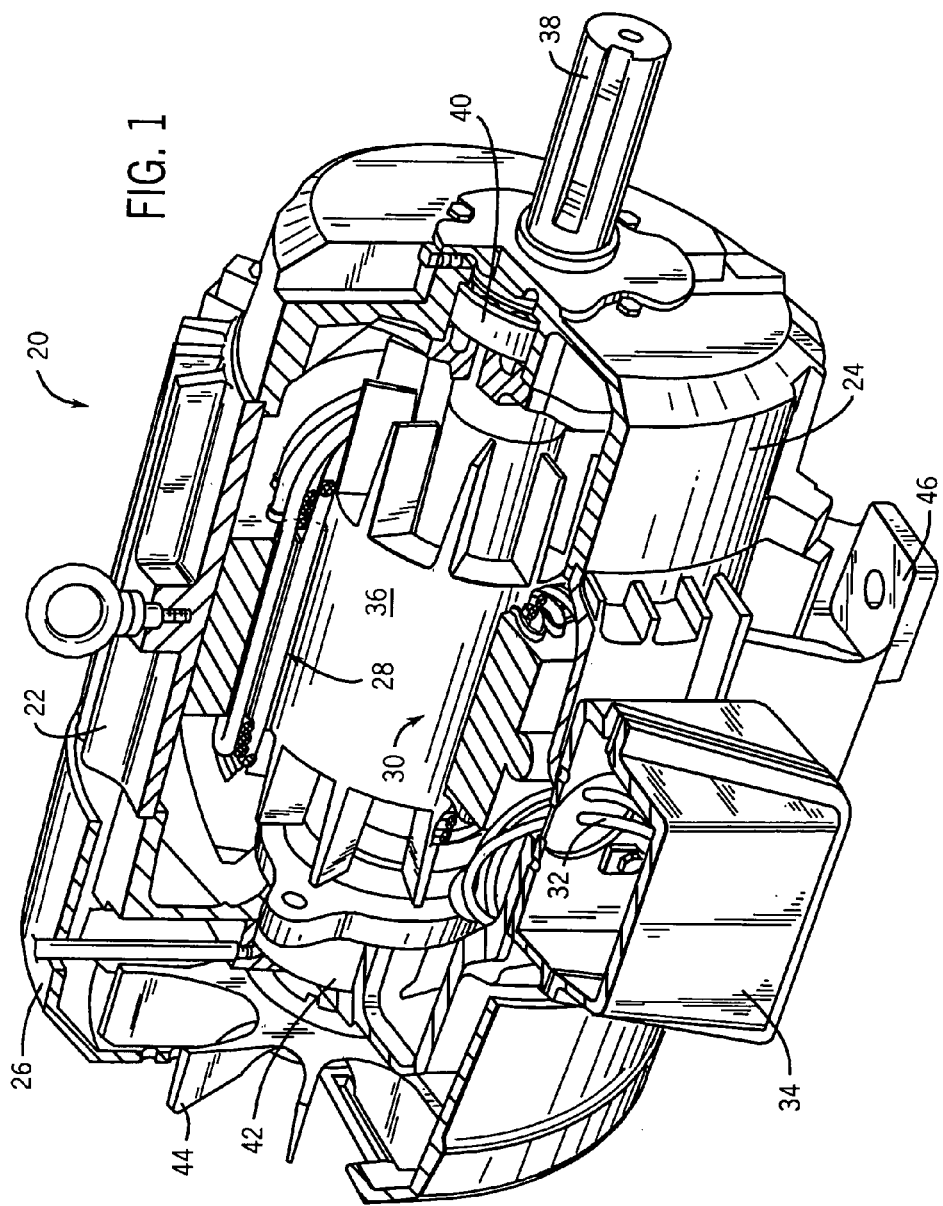
FIG. 1 is a perspective view of an electric motor illustrating the various functional components of the motor including a rotor and a stator, in accordance with certain aspects of the invention.

Turning now to the drawings, and referring first to FIG. 1, an electric motor is shown and designated generally by the reference numeral 20. In the embodiment illustrated in FIG. 1, motor 20 is an induction motor housed in a conventional NEMA enclosure. Accordingly, motor 20 includes a frame 22 open at front and rear ends and capped by a front end cap 24 and a rear end cap 26. The frame 22, front end cap 24, and rear end cap 26 form a protective shell, or housing, for a stator assembly 28 and a rotor assembly 30. Stator windings are electrically interconnected to form groups, and the groups are, in turn, interconnected. The windings are further coupled to terminal leads 32. The terminal leads 32 are used to electrically connect the stator windings to an external power cable (not shown) coupled to a source of electrical power. Energizing the stator windings produces a magnetic field that induces rotation of the rotor assembly 30. The electrical connection between the terminal leads and the power cable is housed within a conduit box 34.

In the embodiment illustrated, rotor assembly 30 comprises a cast rotor 36 supported on a rotary shaft 38. As will be appreciated by those skilled in the art, shaft 38 is configured for coupling to a driven machine element (not shown), for transmitting torque to the machine element. Rotor 36 and shaft 38 are supported for rotation within frame 22 by a front bearing set 40 and a rear bearing set 42 carried by front end cap 24 and rear end cap 26, respectively. In the illustrated embodiment of electric motor 20, a cooling fan 44 is supported for rotation on shaft 38 to promote convective heat transfer through the frame 22. The frame 22 generally includes features permitting it to be mounted in a desired application, such as integral mounting feet 46. As will be appreciated by those skilled in the art, however, a wide variety of rotor configurations may be envisaged in motors that may employ the techniques outlined herein, including wound rotors of the type shown, and so forth. Similarly, the present technique may be applied to a variety of motor types having different frame designs, mounting and cooling styles, and so forth.

Figure 2:
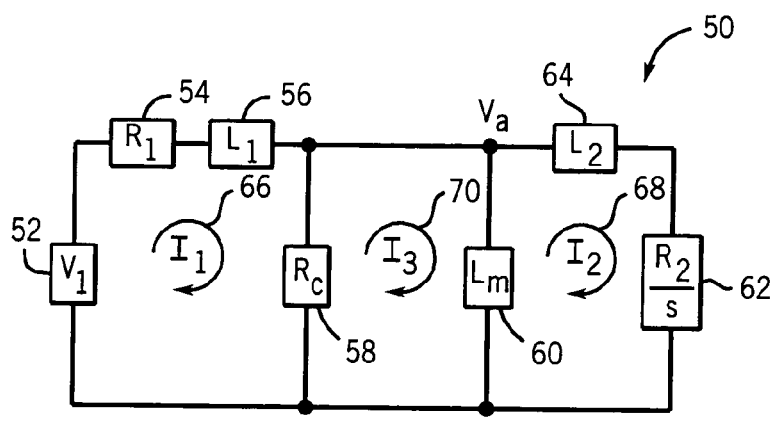
FIG. 2 is the single-phase steady state equivalent schematic circuit of an induction motor, according to an exemplary embodiment of the present technique.

Referring generally to FIG. 2, an equivalent circuit for steady state operation of the induction motor of FIG. 1 is shown and designated generally by the reference numeral 50. The induction motor is powered by an AC power source, designated by reference numeral 52, having a voltage amplitude $V_1$ and a frequency $\omega$. The stator of the motor has an electrical resistance $R_1$, as represented by reference numeral 54, and a leakage inductance $L_1$, as represented by reference numeral 56. The motor also has core loss resistance $R_c$ due to core losses in the stator and rotor, designated by the reference numeral 58. The motor also has a magnetizing inductance $L_m$, designated by reference numeral 60. The rotor also has an electrical resistance $R_2$, designated by reference numeral 62. As illustrated, the rotor resistance $R_2$ is modified by dividing the rotor resistance $R_2$ by the slip s of the rotor. Finally, the rotor also has a leakage inductance $L_2$, as represented by reference numeral 64. Electric current flows through the stator to produce the magnetic field. The electric current $I_1$ through the stator is represented by arrow 66. In addition, the magnetic field induces an electric current $I_2$ in the rotor, as represented by arrow 68. Finally, electric current $I_3$ flowing through the core loss resistance $R_c$ and the magnetizing inductance $L_m$ is represented by arrow 70.

In a typical AC circuit, the voltage and current vary over time. In an inductive circuit, such as an induction motor, the voltage leads the current by an angle, known as the phase angle $\phi$. In addition, some power is alternately stored and released by the inductance of the circuit. This power is known as the "reactive power." In addition, the resistance of the circuit dissipates power as heat and the load utilizes a portion of the input power, this power is known as the "real power." The "apparent power" is the product of the total voltage and the total current in the AC circuit. The ratio between the real power and the apparent power of a load in an AC circuit is known as the "power factor" of the load. The cosine of the phase angle is the power factor.

Figure 3:
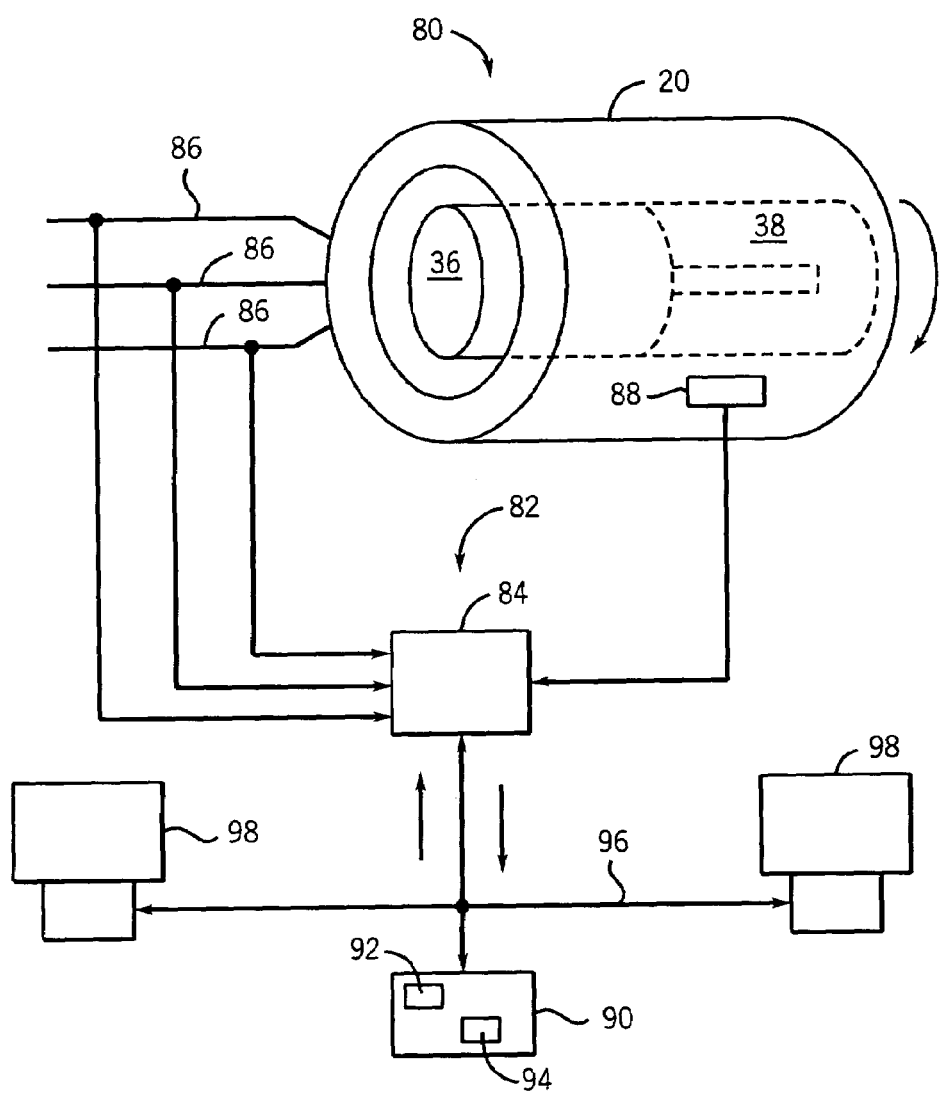
FIG. 3 is a system for providing estimated values of various motor operating parameters, according to an exemplary embodiment of the present technique.

Referring generally to FIG. 3, a system for providing estimated values of various motor electrical parameters and motor operating parameters is shown and designated generally by reference numeral 80. The system 80 comprises a data processing module 82 that is electrically coupleable to the motor 20. The data processing module 82 is operable to utilize data obtained at two load conditions of the motor 20 to establish values of various electrical parameters of the motor, such as the electrical resistance of the rotor and the leakage inductance of the stator and rotor. The data processing module then uses the values of the estimated motor electrical parameters to estimate motor operating parameters, such as the temperature of the rotor, the torque of the motor, and the efficiency of the motor. The data processing module 82 may be provided as a stand-alone device, as part of a motor, or in a kit form to be added to an existing installed motor.

In the illustrated embodiment, the data processing module 82 has a processor module 84. Preferably, the processor module 84 utilizes a processor (not shown) and operates in accordance with programming instructions to produce estimates of various motor operating parameters. The processor module 84 may have analog-to-digital converters for converting analog data into digital data. In this embodiment, the processor module 84 is electrically coupled to each phase 86 of the input power to the motor 28 to enable the module to receive electrical input data, such as the input voltage, current, frequency, and power. However, the data also may be entered into the system manually. The input voltage data may be the line-to-line voltage or the phase voltage. The average phase voltage for a connection may be established by averaging the three line-to-line voltages and dividing by the $\sqrt{3}$. The average line current is the phase current. Input power data also may be obtained directly or calculated from the stator voltage, current, and resistance data. A speed sensor 88 also is electrically coupled to the processor module 84. The speed sensor 88 may be integral with the motor or a separate device coupled to the processor module 84. The speed sensor 88 may measure the speed of the shaft 38 coupled to the rotor 36 in order to establish rotor speed. Alternatively, the speed sensor 88 may measure the speed of the rotor 36 directly.

In the illustrated embodiment, the system 80 is operable to output motor electrical parameter data and motor operating parameter data to a control module 90. Preferably, the control module 90 has a visual display 92 to provide visual indications of the various parameters. Preferably, the control module 90 has a keypad or keyboard 94 to enable data, such as the electrical input data, rotor speed data, and any known motor electrical parameters, to be inputted into the processor module 84. In addition, in the illustrated embodiment the processor module 84 and the control module 90 are coupled to a network 96 to enable data to be transferred to or from remote terminals 98. The remote terminals 98 may be personal computers, or other digital communication devices.

The electrical input data may also be measured at the motor controller, rather than at the motor itself. However, in certain applications the motor controller may be quite remote from the motor. To facilitate the measurement of data at the motor, such as the rotor speed, and at other locations, such as at a motor controller, a time log of the measured voltages, currents, power and frequency may be used to record data. The voltages, currents, power and frequency corresponding to the time of the speed measurement are retrieved from the time log and matched to the speed of the rotor at that time. An adjustment also can be provided for the effect on the electrical input data caused by taking the measurement at the motor controller. First, the length of the cable between the motor and the starter may be measured. In addition, the ambient temperature is measured and the gauge of the cable identified. The diameter of the conductor may be calculated from the gauge of the cable. The resistance of the cable may be estimated based on the operating temperature, the length and diameter of the cable. The cable resistance is then subtracted from the total measured resistance to establish the stator resistance. Furthermore, the power loss in the cable may be established from the measured current and estimated cable resistance. The cable power is then subtracted from the measured power to obtain the power delivered to the motor.

Figure 4:
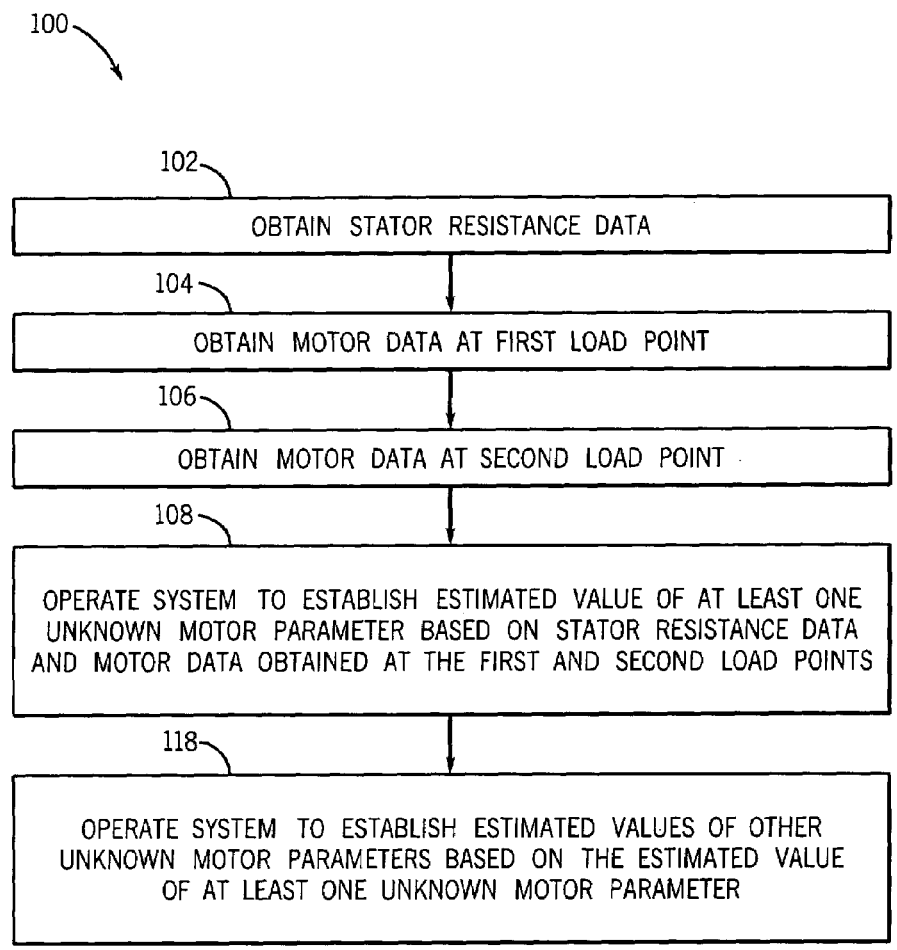
FIG. 4 is a process for providing estimated values of various motor operating parameters based on data obtained at two load conditions of the motor, according to an exemplary embodiment of the present technique.

Referring generally to FIG. 4, a process for establishing values of various motor electrical parameters and various motor operating parameters using the system of FIG. 3 is shown and designated generally by reference numeral 100. The process comprises obtaining the resistance of the stator, as represented by block 102. The process also comprises obtaining data at a first operating load point and providing the data to the processor module 84, as represented by block 104. In a presently contemplated embodiment, the data obtained at the first load point comprises: input voltage data, input current data, input power data, and shaft speed data. It should be noted that the input power can either be measured or calculated from the other input data. In addition, the process may measure motor frequency and temperature. Some data may be provided to the system 80 using the control module 90 or may be provided from a remote station 98 via the network 96. Preferably, the motor has a low load at the first operating point.

The process also comprises obtaining data from the motor at a second load point and providing the data to the processor module 84, as represented by block 106. The stator resistance $R_1$ data need only be obtained once if the stator temperature is obtained at each load point. Preferably, the motor has a full load at the second load point.

Figure 5:
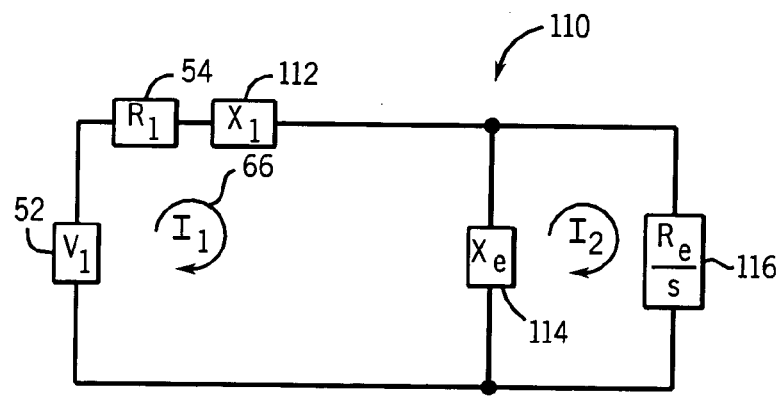
FIG. 5 is an alternative equivalent schematic circuit of a steady state induction motor, according to an exemplary embodiment of the present technique.

The data processing module 82 may then be operated to establish estimated values of various motor parameters, as represented by block 108. The programming instructions provided to the data processing module 82 are adapted to utilize a novel technique for establishing the values of the various motor parameters. The equivalent circuit of FIG. 2 provides a starting point to illustrate the development of the technique for estimating various motor parameters. Referring generally to FIG. 5, an equivalent circuit, designated generally by reference numeral 110, to the circuit of FIG. 2 is illustrated. In FIG. 5, each inductance illustrated in FIG. 2 is converted into an inductive reactance to facilitate solving for the unknown motor parameters. In addition, some of the reactances are combined to simplify the circuit 110. The stator leakage reactance $X_1$, designated by reference numeral 112, is a function of the electrical frequency $\omega$ of the power source and the stator leakage inductance $L_1$. The equivalent reactance $X_e$, designated by reference numeral 114, is a function of the magnetizing reactance $X_m$, the rotor resistance $R_2$, the slip s and the rotor leakage reactance $X_2$. The magnetizing reactance $X_m$, in turn, is a function of the electrical frequency $\omega$ and the magnetizing inductance $L_m$. The rotor leakage reactance $X_2$ is a function of the electrical frequency $\omega$ and the rotor leakage inductance $L_2$. The equivalent resistance $R_e$, designated by reference numeral 116, is a function of the rotor resistance $R_2$, the leakage reactance $X_2$, the slip s, and the core loss resistance $R_c$. Of the parameters illustrated in FIGS. 2 and 5, the stator resistance $R_1$ and the motor slip s can be measured relatively easily. This leaves the values of five parameters to be established: $X_1, R_2, X_2, R_c,$ and $X_m$. These parameters are more difficult to measure than the stator resistance $R_1$ and the motor slip s.

Several assumptions and an approximation are made to simplify the process of developing a technique for estimating $X_1, R_2, X_2, R_c,$ and $X_m$. Namely, it is assumed that the frequency of the power is constant, that the speed of the rotor does not change during the gathering of the load point data, and that the reading of the data is done quickly so that the rotor temperature is constant during the gathering of the data. Additionally, it has been established experimentally that excellent results are obtained by estimating the stator leakage reactance $X_1$ to be 5% of the magnetizing reactance $X_m$, or:

$$X_1 = 0.05 X_m. \tag{1}$$

However, this factor may range from 0.02 to 0.07. By making this approximation the number of unknowns is reduced to four. Thus, only four equations are needed to solve for the values of the remaining unknown motor parameters. However, the equations relating these unknowns are highly nonlinear and an expression for the remaining unknowns by using measurements obtained at two load points is nontrivial. In the present technique, this process is facilitated by obtaining an actual value for the stator leakage reactance $X_1$. This value is then used in finding the values of the remaining unknowns.

In addition, the rotor leakage inductance $L_2$ and magnetizing inductance $L_m$ are converted into reactances in FIG. 5 to assist in solving the various unknown motor parameters. Reactance is a function of the inductance and the frequency $\omega$ of the circuit. The reactances were combined with the rotor resistance $R_2$ and the core loss resistance $R_c$ to form an equivalent reactance $X_e$ and a total resistance $R_t$. At a first load point, the total resistance $R_{t1}$ is given by the following equation:

$$\frac{1}{R_{t1}} = \frac{1}{R_c} + \frac{1}{\left(\frac{R_2}{s_1} + \frac{s_1 X_2^2}{R_2}\right)}. \tag{2}$$

The first term on the right side of the equation is the reciprocal of the core loss resistance $R_c$ and the second term is the reciprocal of the new modified rotor resistance as a result of factoring the rotor leakage reactance $X_2$. At the second load point, the total resistance $R_{t2}$ is given by the following equation:

$$\frac{1}{R_{t2}} = \frac{1}{R_c} + \frac{1}{\left(\frac{R_2}{s_2} + \frac{s_2 X_2^2}{R_2}\right)}. \tag{3}$$

Similarly, the equivalent reactances at the two motor load points $X_{e1}$ and $X_{e2}$ are given by the following equations:

$$\frac{1}{X_{e1}} = \frac{1}{X_m} + \frac{X_2}{\left(\frac{R_2^2}{s_1^2} + X_2^2\right)}; \text{ and} \tag{4}$$

$$\frac{1}{X_{e2}} = \frac{1}{X_m} + \frac{X_2}{\left(\frac{R_2^2}{s_2^2} + X_2^2\right)}. \tag{5}$$

The right hand sides of equations (4) and (5) also have two terms, one resulting from the magnetizing reactance $X_m$ and the other resulting from factoring the rotor leakage reactance $X_2$.

The following equations for equivalent reactance $X_e$ and equivalent resistance $R_e$ may be developed using FIG. 5 and data obtained at the two load points of the motor. The equation for the equivalent reactance $X_e$ is given as follows:

$$X_e = \frac{-B}{2A} + \frac{\sqrt{B^2 - 4AC}}{2A}, \quad (6)$$

where A, B, and C are given by:

$$A = 1.05 * 0.05 * sI_1^2; \quad (7)$$

$$B = -1.1 I_1 V_1 s; \text{ and} \quad (8)$$

$$C = V_{1i}^2 s + (sR_1 I_1 - sV_{1R})(I_1 R_1 - V_{1R}). \quad (9)$$

$V_{1i}$ is the imaginary portion of the voltage and is a function of the amplitude of the power source voltage $V_1$ and the sine of the power factor angle. $V_{1R}$ is the real portion of the voltage and is a function of the amplitude of the power source voltage $V_1$ and the cosine of the phase angle. In addition, the equivalent resistance $R_e$ is given by the following equation:

$$R_e = \frac{sX_e(V_{1j} - .05 I_1 X_e)}{(V_{1R} - I_1 R_1)}. \quad (10)$$

As discussed above, it was assumed that the stator leakage reactance is 5%, or 0.05 of the magnetizing reactance $X_m$. With no load on the motor, the rotor section of the circuit is considered open and the value for the slip s is considered to be zero. The total reactance of the circuit is made of the sum of the stator leakage reactance $X_1$ and the magnetizing reactance $X_m$. Since $X_1$ can be expressed as equal to 0.05 $X_m$, then the total no-load reactance can be written as 1.05 $X_m$. The value of $X_e$ at the two load points is used to extrapolate the value at no-load to yield $X_m$. The value of $X_e$ at zero-load is the magnetizing reactance $X_m$. In addition, the slip s is used as a measure of the load. Through experimentation using different load points and different motors, it has been found that the following equation yields a very close value for the magnetizing reactance $X_{mi}$ to be used for estimating the stator leakage reactance $X_1$:

$$X_{mi} = X_{e1} + \frac{(X_{e2} - X_{e1}) s_1^{\frac{1}{4}}}{(s_1 - s_2)^{\frac{1}{4}}}. \quad (11)$$

In equation (11) above, $s_1$ is the slip at a high load and $s_2$ is the slip at a low load, noting that $s_1$ is greater than $s_2$. The value of $X_{mi}$ may then be used to establish the value of $X_1$, in accordance with equation (1) provided above.

Once the value of $X_1$ is obtained, new values for $R_t$ and $X_e$ may be obtained. These new values of $R_t$ and $X_e$ are based on a fixed known value of the stator reactance $X_1$, and may be determined in accordance with the following equations:

$$\alpha_1 = \frac{1}{R_{t1}} - \frac{1}{R_{t2}}; \text{ and} \quad (12)$$

-continued $$\alpha_2 = \frac{1}{X_{e1}} - \frac{1}{X_{e2}}. \quad (13)$$

There now are four equations and four unknowns. The unknowns are $R_2$, $X_2$, $R_c$, and $X_m$. To eliminate $R_c$, equation (3) is subtracted from equation (2) to yield the following equation:

$$\alpha_1 = \frac{\frac{R_2}{s_1}\left(\frac{R_2^2}{s_2^2} + X_2^2\right) - \frac{R_2}{s_2}\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \quad (14)$$

To eliminate $X_m$, equation (5) is subtracted from equation (4) yielding the following equation:

$$\alpha_2 = \frac{X_2\left(\frac{R_2^2}{s_2^2} + X_2^2\right) - X_2\left(\frac{R_2^2}{s_1^2} + X_2^2\right)}{\left(\frac{R_2^2}{s_1^2} + X_2^2\right)\left(\frac{R_2^2}{s_2^2} + X_2^2\right)}. \quad (15)$$

From the equations provided above, equations may now be established for $R_2$, $X_2$, $R_c$, and $X_m$. By dividing equation (14) by equation (15), the following relationship for the $X_2$ and $R_2$ can be established:

$$X_2 = \gamma R_2. \quad (16)$$

where $\gamma$ is given by the following equation:

$$\gamma = \frac{-\alpha_1(s_1 + s_2)}{2\alpha_2 s_1 s_2} + \frac{\sqrt{\left(\frac{\alpha_1}{\alpha_2}\right)^2 (s_1 + s_2)^2 + 4 s_1 s_2}}{2 s_1 s_2}. \quad (17)$$

The rotor resistance $R_2$ may be established by substituting $\gamma R_2$ for $X_2$ in equation (15) and using algebraic manipulation to produce the following equation:

$$R_2 = \frac{\frac{\gamma}{\alpha_2}}{\left(\frac{1}{s_1^2 + \gamma^2}\right)} - \frac{\frac{\gamma}{\alpha_2}}{\left(\frac{1}{s_2^2 + \gamma^2}\right)}. \quad (18)$$

In addition, the core loss resistance $R_c$ may be established in terms of $R_2$ and $X_2$ by manipulating equation (2) to produce the following equation:

$$R_c = \frac{1}{\left(\frac{1}{R_{t1}} - \frac{\frac{R_2}{s_1}}{\left(\frac{R_2^2}{s_1^2} + X_2^2\right)}\right)} \quad (19)$$

Finally, the magnetizing reactance $X_m$ may be established in terms of $R_2$ and $X_2$ by manipulating equation (4) to produce the following equation:

$$X_m = \frac{1}{\left(\frac{1}{X_{e1}} - \frac{X_2}{\left(\frac{R_2^2}{s_1^2} + X_2^2\right)}\right)}. \tag{20}$$

The data processing module 82 is programmed to use the above-described equations and methodology to establish estimated values of rotor resistance $R_2$, leakage reactance $X_2$, core loss resistance $R_c$, and magnetizing reactance $X_m$. Voltage and current input data are obtained at the two load points and provided to the processor module 84. Input power data also may be obtained at the same two points or calculated from the voltage, current, and/or resistance data. In addition, motor speed data also is provided to the data processing module 82. The motor speed data may be the RPM of the motor or the slip. Ideally, the measurements at the two load points are made simultaneously to avoid potential change due to a change in the operating condition of the motor. In addition, in the illustrated embodiment the line-to-line electrical resistance of the stator is provided to the processor. The phase resistance is established by averaging the line-to-line resistance and dividing by 2. The data processing module 82 is operable to establish the value of the equivalent reactances $X_{e1}$ and $X_{e2}$ using equations (6) through (10) provided above at each load point. The processor also is operable to establish the initial magnetizing reactance $X_{mi}$ using equation (11) provided above. In addition, the processor is operable to establish the value of the phase leakage reactance $X_1$ from the magnetizing reactance $X_{mi}$. Using the value of $X_1$, the processor is operable to find new values for the equivalent resistances $R_{t1}$, $R_{t2}$, $X_{e1}$, and $X_{e2}$, where:

$$R_{t1} = \frac{R_{e1}}{s_1}; \text{ and} \tag{21}$$

$$R_{t2} = \frac{R_{e2}}{s_2}. \tag{22}$$

The system may also be operated to estimate motor operating parameters based on the values of $X_1$, $R_2$, $X_2$, $R_c$, and $X_m$, as represented by block 118. For example, the system may be adapted to establish the values of the rotor torque T, the rotor temperature, and the motor efficiency based on the values of $R_2$, $X_2$, $R_c$, and $X_m$, electrical input data and rotor speed data. The rotor current $I_2$ may be established using the following equation:

$$I_2 = \left(I_1 - \frac{(V_{1R} - I_1 R_1)}{R_c} - \frac{(V_{1i} - I_1 X_1)}{X_m}\right) + j\left(\frac{(V_{1R} - I_1 R_1)}{X_m} - \frac{(V_{1i} - I_1 X_1)}{R_c}\right). \tag{23}$$

The shaft torque may be obtained from the rotor resistance $R_2$ and the rotor current $I_2$, as follows:

$$T(N\text{-}m) = \frac{3 I_{2rms}^2 R_2}{\omega_s s}. \tag{24}$$

In the above equation, $I_{2rms}$ is the RMS value of the rotor current $I_2$, and $\omega_2$ is the mechanical synchronous speed in rad/second given by:

$$\omega_s = \frac{4\pi f}{p}. \tag{25}$$

In this equation, f is the alternating current frequency in Hz and p is the number of poles of the motor.

The shaft torque may be converted to foot-pounds by multiplying the torque in Newton-meters by 0.738. In addition, the shaft torque is modified by subtracting the friction and windage loss $R_{F\&W}$ and the stray load loss using published values and IEEE standards, as shown in the following table:

| Motor Power | SLL % of output power |
|---|---|
| 1–125 HP | 1.8 |
| 126–500 HP | 1.5 |
| 501–2499 HP | 1.2 |

The motor efficiency is established by dividing the estimated output mechanical power by the input electrical power.

$$\eta = \frac{P_{out}}{P_{in}}. \tag{26}$$

The estimated output mechanical power $P_{out}$ may be established from the torque T and the rotor speed data.

The above-described technique was used to estimate the efficiency of a 10 HP motor and a 600 HP motor using data from a motor design program and test data. The following are the results obtained for a 10 HP motor and the discussion of these results.

| Motor Data: | HP: 10 | Elec. Des.: E9893A A |
|---|---|---|
| | RPM: 1175 | Frame: 0256T |
| | Enclosure: TEFC | |
| | Volts: 575 | Design: B |
| | Amp: 10.1 | LR Code: G |
| | Duty: Cont. | Rotor: 418138071HE |
| | INS/AMB/S.F.: F/40/1.15 | Stator: 418126002AJ |
| | TYP/PH/HZ: P/3/60 | FAN: 702675001A |

Using data from the program at full load and at ¼ load, the parameters of the motor were identified using the new method. The following is a summary of the results.

|  | Estimated Efficiency | Program Efficiency | % Error |
| --- | --- | --- | --- |
| Full Load | 91.315 | 91.097 | 0.239% |
| ¾ Load | 92.154 | 91.850 | 0.330% |
| ½ Load | 92.101 | 91.661 | 0.479% |
| ¼ Load | 89.005 | 88.186 | 0.928% |

From the above results it can be seen that the error in the estimated efficiency is less than 1% of the efficiency obtained from the program results. It can also be observed that the error increases as the load decreases. By examining the calculated losses it was noticed that the calculated core loss is less than the program value by 19 watts. This fixed error becomes a larger percentage of the total loss at low loads and as a result the percentage error in efficiency increases as the load decreases.

The estimated efficiency was also compared to laboratory test data. The following is a summary of the results for the 10 HP motor.

|  | Estimated Efficiency | Actual Efficiency | % Error |
| --- | --- | --- | --- |
| Full Load | 89.98 | 90.310 | −0.36% |
| ¼ Load | 86.18 | 86.530 | −0.41% |

The estimated core loss in this case was more than the measured value leading to a lower estimated efficiency than the measured efficiency.

The procedure was repeated for a 600 HP motor. The following are the results obtained for a 600 HP motor and the discussion of these results.

| Motor Data: | HP: 600 | Elec. Des.: |
| --- | --- | --- |
|  | RPM: 1195 | Frame: 35C5012Z |
|  | Enclosure: TEFC |  |
|  | Volts: 575 | Design: 139481 |
|  | Amp: 532 | LR Code: |
|  | Duty: Cont. | Rotor: 710623-2-S |
|  | INS/AMB/S.F.: F//1.15 | Stator: 710622-2-T |

Comparing the design program data to the estimated values from the above-described process, the following results were obtained:

|  | Estimated Efficiency | Program Efficiency | % Error |
| --- | --- | --- | --- |
| Full Load | 95.794 | 95.791 | 0.003% |
| ¾ Load | 95.843 | 95.855 | −0.013% |
| ½ Load | 95.318 | 95.352 | −0.035% |
| ¼ Load | 92.655 | 92.710 | −0.059% |

The difference between the design program data and estimated value data is less 0.04%. Initially, the resolution selected for use with the design program data for the speed of the motor was one decimal point. The results obtained using one decimal point resolution on speed lead to higher error in estimation. The results provided above were obtained using a higher resolution on speed. In addition, this particular motor has a very low slip. The slip in RPM at full load is less than 5 RPM so that any error in the speed measurement will lead to a large error in estimation. The following are the results obtained using four decimal points resolution, three decimal points resolution, two decimal points and one decimal point resolution to illustrate the effect of resolution on the efficiency estimation.

Four Decimal Points Resolution:

|  | Estimated Efficiency | Program Efficiency | % Error |
| --- | --- | --- | --- |
| Full Load | 95.795 | 95.791 | 0.0036% |
| ¾ Load | 95.844 | 95.855 | −0.0122% |
| ½ Load | 95.320 | 95.352 | −0.0338% |
| ¼ Load | 92.658 | 92.710 | −0.0550% |

Three Decimal Points Resolution:

|  | Estimated Efficiency | Program Efficiency | % Error |
| --- | --- | --- | --- |
| Full Load | 95.797 | 95.791 | 0.0065% |
| ¾ Load | 95.848 | 95.855 | −0.008% |
| ½ Load | 95.325 | 95.352 | −0.028% |
| ¼ Load | 92.669 | 92.710 | −0.044% |

Two Decimal Points Resolution:

|  | Estimated Efficiency | Program Efficiency | % Error |
| --- | --- | --- | --- |
| Full Load | 95.887 | 95.791 | −0.0143% |
| ¾ Load | 95.969 | 95.855 | −0.0364% |
| ½ Load | 95.509 | 95.352 | −.0705% |
| ¼ Load | 93.031 | 92.710 | −0.1297% |

One Decimal Point Resolution:

|  | Estimated Efficiency | Program Efficiency | % Error |
| --- | --- | --- | --- |
| Full Load | 95.008 | 95.791 | −0.817% |
| ¾ Load | 94.776 | 95.855 | −0.840% |
| ½ Load | 93.708 | 95.352 | −1.200% |
| ¼ Load | 89.494 | 92.710 | −3.486% |

From the above results it can be concluded that to provide a good estimation of efficiency for low slip motors using this method it is preferable to have a resolution on speed to at least two decimal points. The reason for this is that if the resolution is less than two decimal points the error in slip causes an error in the estimation of the core loss, yielding a higher overall error.

The system was then operated using lab test data for the 600 HP motor. The resolution of the speed that was used was 1 RPM. This resolution is less than the minimum recommended for obtaining good results. The results using this coarse resolution are shown below.

| | Estimated Efficiency | Program Efficiency | % Error |
|---|---|---|---|
| Full Load | 96.59 | 96.65 | −0.052% |
| ¾ Load | 95.87 | 96.68 | −0.840% |
| ½ Load | 95.02 | 96.17 | −1.20% |
| ¼ Load | 95.95 | 93.62 | 2.480% |

From these results, it can be concluded that the method yields excellent results for regular slip motors. However, for low slip motors the resolution on the RPM of the motor is preferably at least two decimal points so as to get a good estimate of the motor efficiency in the field. One way of obtaining excellent resolution of the motor speed is by using accelerometers to measure the motor vibration and find its spectrum.

A comparison between the losses seen in the design program and the estimated losses using the above-described method is provided below.

| | Design Program | New Method |
|---|---|---|
| Rotor Loss: | | |
| Full Load | 1.79 KW | 1.785 KW |
| ¾ Load | .980 KW | .979 KW |
| ½ Load | .430 KW | .429 KW |
| ¼ Load | .107 KW | .107 KW |
| Core Loss: | | |
| Full Load | 5.77 KW | 5.756 KW |
| ¾ Load | 5.81 KW | 5.852 KW |
| ½ Load | 5.85 KW | 5.924 KW |
| ¼ Load | 5.9 KW | 5.975 KW |

The results illustrate general agreement between the design program results and the new method of estimating motor parameters describe above.

Figure 6:
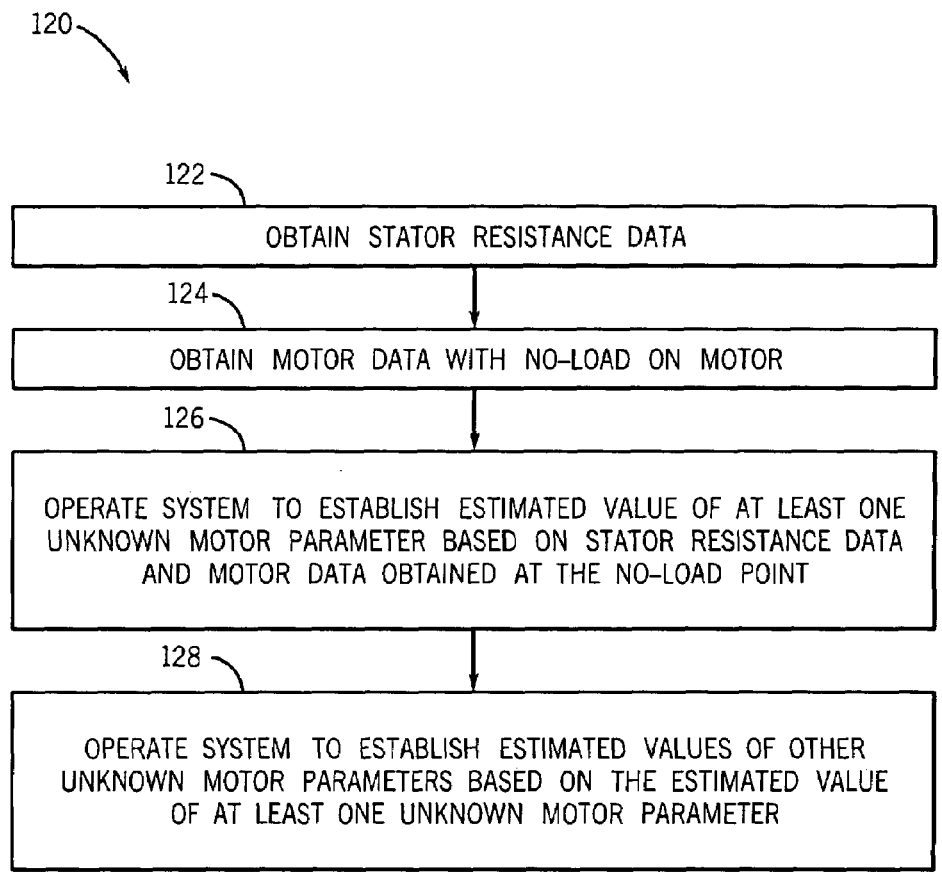
FIG. 6 is an alternative process for providing estimated values of various motor operating parameters based on data obtained with no-load on the motor, according to an exemplary embodiment of the present technique.

Referring generally to FIG. 6, an alternative process for establishing estimated values of various motor electrical parameters using data obtained at a single operating point with no load on the motor is shown and designated generally by reference numeral 120. In addition, the estimated values of the motor electrical parameters may be used to establish estimated values of various motor operating parameters. The process comprises obtaining stator resistance $R_1$ data, as represented by block 122. The line-to-line input resistance may be measured, averaged, and divided by 2 to determine the phase resistance $R_1$. The process also comprises obtaining electrical input data with no load on the motor and providing the data to the processor module 84, as represented by block 124. To achieve the no-load condition, the motor is disconnected from its load. The electrical input data obtained at the first load points comprises: input voltage data, input current data. Some data may be provided to the system 80 using the control module 90 or may be provided from a remote station 98 via the network 96. The current with no-load $I_{nl}$ may be measured for each phase and averaged. The three line voltages may be measured, averaged, and divide by √3 to determine the phase voltage $V_1$.

The data processing module 82 may then be operated to establish estimated values of various motor parameters, as represented by block 126. The programming instructions are provided to the data processing module 82 are adapted to utilize a novel technique for establishing the values of the various motor parameters using data obtained with no-load on the motor. With no load on the motor, the rotor portion of the circuit will effectively be an open circuit and is assumed to be an open circuit for these purposes. The current $I_2$ will be sufficiently small to handle the windage and friction load of the rotor. With no load on the motor, the stator current $I_1$ will be the no-load current $I_{nl}$. The stator leakage inductance $L_1$, the magnetizing inductance $L_m$ and the core loss resistance $R_c$ may be established using the following equations. First, the total resistance $R_t$ may be obtained by the following equation:

$$R_t = \frac{P}{I_{nl}^2}. \tag{27}$$

The total impedance Z may be found by dividing the input voltage $V_1$ by the no-load current $I_{Nl}$, as follows:

$$Z = \frac{V_1}{I_{nl}}. \tag{28}$$

The total reactance $X_1+X_m$ may be found from the total impedance Z and the total resistance $R_1$, as follows:

$$X_1+X_m = \sqrt{Z^2 - R_t^2}. \tag{29}$$

The individual values for the stator reactance $X_1$ and the magnetizing reactance $X_m$ may be found from the assumed relationship of $X_1 = 0.05\ X_m$, as follows:

$$X_1 + X_m = 1.05 X_m. \tag{30}$$

Next, the motor friction and windage power $P_{F\&W}$ may be estimated based on the motor size and construction, if known. If not, the motor friction and windage power $P_{F\&W}$ is combined with the core loss. The equivalent resistance $R_{W\&F}$ due to motor friction and windage power $P_{F\&W}$ may be estimated as follows:

$$R_{W\&F} = \frac{P_{W\&F}}{I_{nl}^2}. \tag{31}$$

The series core loss resistance $R_m$, may be established as follows:

$$R_m = R_t - R_1 - R_{W\&F}. \tag{32}$$

The parallel magnetizing inductance $L_m$, may be established as follows:

$$L_m = \frac{X_m^2 + R_m^2}{X_m \omega}. \tag{33}$$

The parallel core resistance $R_c$, may be established as follows:

$$R_c = \frac{X_m^2 + R_m^2}{R_m}. \tag{34}$$

The stator leakage inductance $L_1$, may be established as follows:

$$L_1 = \frac{X_1}{\omega}. \tag{35}$$

As with the previous two load point method, the data processing module 82 may be used to estimate other motor parameters based on the estimated motor electrical parameter data obtained above, as represented by block 128. An expression of the rotor current $I_2$ may be obtained from the voltage across the rotor and the rotor impedance. Designating the voltage across the rotor as $V_a$ and the rotor current as $I_2$, the following equation can be written:

$$I_2 = \frac{V_a}{\frac{R_2}{S} + j\omega L_2}. \tag{36}$$

The rotor current can also be expressed using the input current $I_1$, the current through the magnetizing inductance $I_m$, and the current through the core resistance $I_c$, as follows:

$$I_2 = I_1 - I_c - I_m. \tag{37}$$

The above currents can be expressed in terms of the voltage and the value of the motor parameters as follows:

$$V_a = V_1 - I_1(R_1 + j\omega L_1); \tag{38}$$

$$I_c = \frac{V_a}{R_c}; \text{ and} \tag{39}$$

$$I_m = \frac{V_a}{j\omega L_m}. \tag{40}$$

The following expression for $I_2$ may be obtained by manipulating the equations above and substituting the expressions for $I_1$, $I_c$, and $I_m$ from equations (38)–(40) into equation (37):

$$I_2 = I_1 - \frac{(V_1 - I_1(R_1 + j\omega L_1))}{R_c} - \frac{(V_1 - I_1(R_1 + j\omega L_1))}{j\omega L_m}. \tag{41}$$

Equations (36) and (41) can now be equated to obtain an equation relating the input current, the input voltage, and the motor parameters. Because the resulting equation has a real part and imaginary part, this will yield two equations. The input current can be written as a complex quantity:

$$I_1 = I_{1R} - jI_{1i}. \tag{42}$$

Two equations, one representing the real part and one representing the imaginary part, may be obtained using equations (34), (39) and (40). The real part is as follows:

$$\left(I_{1R} - \frac{V_1}{R_c} + \frac{I_{1R}R_1}{R_c} + \frac{I_{1i}\omega L_1}{R_c} + \frac{I_{1R}L_1}{L_m} - \frac{R_1 I_{1i}}{\omega L_m}\right)\left(\frac{R_2^2}{s^2} + \omega^2 L_2^2\right) = \tag{43}$$

$$\left(\frac{R_2}{s}\right)(V_1 - I_{1R}R_1 - I_{1i}\omega L_1) - \omega L_2(\omega L_1 I_{1r} - R_1 I_{1i})$$

The imaginary part will be given by:

$$\left(-I_{1i} + \frac{\omega L_1 I_{1R}}{R_c} - \frac{R_1 I_{1i}}{R_c} + \frac{V_1}{\omega L_m} - \frac{I_{1R}R_1}{\omega L_m} - \frac{I_{1i}L_1}{L_m}\right) \cdot \left(\frac{R_2^2}{s^2} + \omega^2 L_2^2\right) = \tag{44}$$

$$-\frac{R_2}{s}(\omega L_1 I_{1R} - R_1 I_{1i}) - \omega L_2(V_1 - I_{1R}R_1 - I_{1i}\omega L_1)$$

Equations 43 and 44 can be written as:

$$\alpha_1\left(\frac{R_2^2}{s^2} + \omega^2 L_2^2\right) = \alpha_2 R_2 + \alpha_3 L_2; \text{ and} \tag{45}$$

$$\beta_1\left(\frac{R_2^2}{s^2} + \omega^2 L_2^2\right) = \beta_2 R_2 + \beta_3 L_2; \tag{46}$$

where the different variables are given by:

$$\alpha_1 = I_{1R} - \frac{V_1}{R_c} + \frac{I_{1R}R_1}{R_c} + \frac{I_{1i}\omega L_1}{R_c} + \frac{L_1 I_{1R}}{L_m} - \frac{R_1 I_{1i}}{\omega L_m}; \tag{47}$$

$$\alpha_2 = \frac{V_1 - I_{1R}R_1 - I_{1i}\omega L_1}{s}; \tag{48}$$

$$\alpha_3 = -\omega(\omega L_1 I_{1R} - R_1 I_{1i}); \tag{49}$$

$$\beta_1 = -I_{1i} + \frac{\omega L_1 I_{1R}}{R_c} - \frac{R_1 I_{1i}}{R_c} + \frac{V_1}{\omega L_m} - \frac{I_{1R}R_1}{\omega L_m} - \frac{I_{1i}L_1}{L_m}; \tag{50}$$

$$\beta_2 = \frac{\alpha_3 s}{\omega}; \text{ and} \tag{51}$$

$$\beta_3 = -\alpha_2 \omega s. \tag{52}$$

Dividing equations (43) and (44) and solving for the rotor inductance in terms of the rotor resistance one gets:

$$L_2 = \gamma R_2; \tag{53}$$

$$\text{where}: \gamma = \frac{\alpha_1 \beta_2 - \alpha_2 \beta_1}{\alpha_3 \beta_1 - \alpha_1 \beta_3}. \tag{54}$$

Solving for the rotor resistance, the following relationship results:

$$R_2 = \frac{\frac{\alpha_2}{\alpha_1} + \frac{\alpha_3 \gamma}{\alpha_1}}{\omega^2 \gamma^2 + 1/s^2}. \tag{55}$$

The following process may be used for calculating motor torque and motor efficiency. First, estimate the slip s from the shaft speed N and the synchronous speed $N_s$, as follows:

$$s = \frac{N_S - N}{N_S}. \tag{56}$$

The synchronous speed $N_s$ may be obtained from the input frequency and the number of poles of the motor. The power factor may then be computed using the input current, input voltage, and input power.

Next, the real and imaginary components of the current $I_{1R}$ & $I_{1i}$ are established using equations (47–54). The rotor resistance may then be established using the following equation:

$$R_2 = \frac{\left(\frac{\alpha_2}{\alpha_1} + \frac{\alpha_3}{\alpha_1}\gamma\right)}{\left(\omega^2\gamma^2 + \frac{1}{s^2}\right)}. \tag{57}$$

The rotor current and torque can be calculated using the following equations:

$$I_2 = \sqrt{\alpha_1^2 + \beta_1^2}. \tag{58}$$

The torque T may be estimated by:

$$T \text{ (in Newton-meters)} = \frac{3 * I_{2rms}^2 * R_2}{\omega_s * S}; \text{ where } \omega_s = \frac{4\pi f}{p} \tag{59}$$

is the synchronous speed and p is the number of poles. To convert the torque to ft-lbs multiply the T in Newton-meters by 0.738.

For the purpose of calculating motor efficiency the output power needs to be calculated. This can be obtained using the following equation:

$$\text{Output Power } P_{out} = \frac{TN}{5252} - P_{F\&W} - SLL; \tag{60}$$

where, T is shaft torque in ft-lb and SLL is the stray load power loss, which is typically a known percentage motor power depending on motor size and varies with the square of the torque. The IEEE standard specifies certain percentage of output power as SLL. This percentage changes as the motor power changes. For example, for 1 to 125 HP motors, the SLL is equal to 1.8% of maximum power. For 126 to 500 HP motors, the SLL is equal to 1.5% of maximum power. Finally, for 501 to 2499 HP motors, the SLL is equal to 1.2% of maximum power.

As mentioned above, if the friction and windage loss is not known, its value can be lumped with the core loss. The effect of lumping the friction and windage loss with core loss is to cause the rotor loss to be lower than the actual loss, thus raising the estimated efficiency, since the effect of lumping the friction and windage loss with the core loss is to reduce the power across the air gap by the friction and windage loss. In this circumstance, the rotor loss is the motor slip times the friction and windage loss. To obtain an estimate of the maximum error using this approximation, a value of slip equal to 0.025 and a maximum percentage of friction and windage loss of motor power equal to 3% may be used. This yields a maximum error in estimating the efficiency equal to 0.075%, which is within the measurement error. Tests conducted on different motors indicate the validity of the assumption. If the value of the friction and windage loss is known, then that value may be used. The motor efficiency may then be estimated using the ratio of the estimated output power to the input power. The above-described method was applied to experimental data and the results indicate an accuracy of over 99%.

It is important to note that the core loss is obtained at a constant frequency. If the motor used at a different frequency, then the core loss needs to be estimated at the new frequency. In general the core loss is proportional to the square of frequency and to the magnitude of the flux density. If the flux density is constant then a simple equation can be used to estimate the core loss at a different operating frequency.

Test Results:

The no-load data from three motors were used to test the accuracy of the above method. The following is a summary of the data obtained.

10 HP Motor:

| Motor Data: | HP: 10 | Elec. Des.: E9893A A |
|---|---|---|
| | RPM: 1175 | Frame: 0256T |
| | Enclosure: TEFC | Design: B |
| | Volts: 575 | LR Code: G |
| | Amp: 10.1 | Rotor: 418138071HE |
| | Duty: Cont. | Stator: 418126002AJ |
| | INS/AMB/S.F.: F/40/1.15 | FAN: 702675001A |
| | TYP/PH/HZ: P/3/60 | |
| | No load Current: | 4.41 ampere |
| | No Load Voltage: | 574.9 volts |
| | No Load Power: | 261.73 watts |
| | Stator Resistance: | 0.8765 ohm |
| | F&W power: | 57 watts |
| | Stray Load Loss: | 1.13% obtained from experimental data |

The results obtained are as follows:

| Actual Motor Efficiency at full load = | 90.2434% |
|---|---|
| Estimated Motor Efficiency = | 90.8452% |
| Estimation Error = | 0.6357% |

150 HP Motor:

| Motor Data: | HP: 150 | Elec. Des.: W00868-A-A001 |
|---|---|---|
| | RPM: 1180 | Frame: EC360 |
| | Enclosure: TENV | |
| | Volts: 460 | |
| | Amp: 10.1 | |
| | Duty: 15 Min | |
| | INS/AMB/S.F.: F/ /1.15 | |
| | No Load Current: | 66.09 ampere |
| | No Load Voltage: | 460 volts |
| | No Load Power: | 2261 watts |
| | Stator resistance: | 0.03509 ohm |
| | F & W power: | 896 watts |
| | Stray Load Loss: | 0.85% from test data |

The results obtained are as follows:

| Actual Motor Efficiency at full load = | 93.106% |
|---|---|
| Estimated Motor Efficiency = | 93.413% |
| Estimation Error = | 0.3303% |

600 HP Motor:

| Motor Data: | HP: 600 | Elec. Des.: |
| --- | --- | --- |
| | RPM: 1195 | Frame: 35C5012Z |
| | Enclosure: TEFC | Design: 139481 |
| | Volts: 575 | LR Code: |
| | Amp: 532 | Rotor: 710623-2-S |
| | Duty: Cont. | Stator: 710622-2-T |
| | INS/AMB/S.F.: F/ /1.15 | |
| | No Load Current = | 148.45 ampere |
| | No Load Voltage = | 575 volts |
| | No Load Power = | 6860 watts |
| | Stator resistance = | .0091 ohm |
| | F & W power = | 1725 watts |
| | Stray Load Loss = | 1.3% from Test data |

The results obtained are as follows:

| Actual Motor Efficiency at full load = | 96.025% |
| --- | --- |
| Estimated Motor Efficiency = | 95.976% |
| Estimation Error = | −0.0500% |

To make the estimation of the motor efficiency less sensitive to slight errors in measured frequency, the following process may be performed. First, the stator loss is calculated using the input current and the estimated stator resistance $R_1$. The friction and windage loss is estimated based on the motor size, type, and speed. The rotor loss may be estimated by subtracting the stator loss from the Input power P and multiplying the remainder by the slip. The stray load loss SLL is estimated based on the IEEE standard, as described above, with the exception that the core loss is neglected. The modified input power is then calculated at the two measurement points by subtracting the above losses from the input power P.

A plot of the modified input power versus measured speed may then be performed to determine the core loss. The core loss is the modified input power at the synchronous speed $n_s$. This can be determined mathematically using the following equation:

$$CoreLoss = \left(P_1 - n_1\left(\frac{P_2 - P_1}{n_2 - n_1}\right)\right) + \left(\frac{P_2 - P_1}{n_2 - n_1}\right)n_s; \quad (61)$$

where:
$P_1$ Modified Input power at point 1 "low load"
$P_2$ Modified Input power at point 2 "high load"
$n_1$ Motor speed at point 1
$n_2$ Motor speed at point 2
$n_s$ Synchronous speed using the measured frequency at low load.

The rotor loss and the stray load loss SLL may then be recalculated using the new core loss value. The magnetizing inductance $L_m$, rotor resistance $R_2$, and rotor leakage inductance $L_2$ are calculated as provided previously. This method was found to be less sensitive to error in frequency measurements.

The temperature of the rotor during motor operation may be estimated using the estimated value of the rotor resistance $R_2$ and the following equation relating changes in electrical resistance of the rotor to changes in temperature:

$$R_{2hot} = R_{2cold}(1 + \alpha(T_{hot} - T_{cold})); \quad (62)$$

where: $R_{2\ cold}$ is the rotor resistance at a first temperature; $R_{2\ hot}$ is the rotor resistance at a second temperature; $T_{cold}$ is the rotor temperature at a first temperature; $T_{hot}$ is the rotor temperature at a second temperature; and $\alpha$ is the temperature coefficient of electrical resistance of the rotor in Ω/unit of temperature.

As an example, the above equation may be manipulated algebraically to obtain the following equation for an aluminum rotor:

$$T_{hot} = \frac{R_{2hot}}{R_{2cold}} * (225 + T_{cold}) - 225. \quad (63)$$

The value used for $R_{2\ hot}$ is the estimated value for the rotor resistance $R_2$ at the second temperature $T_{hot}$. The control module 90 may be used to input the rotor temperature at the first temperature $T_{cold}$ and the rotor resistance at the first temperature $R_{2\ cold}$. In addition, the data may be provided by the remote stations 98 via the network 96.

Figure 7:
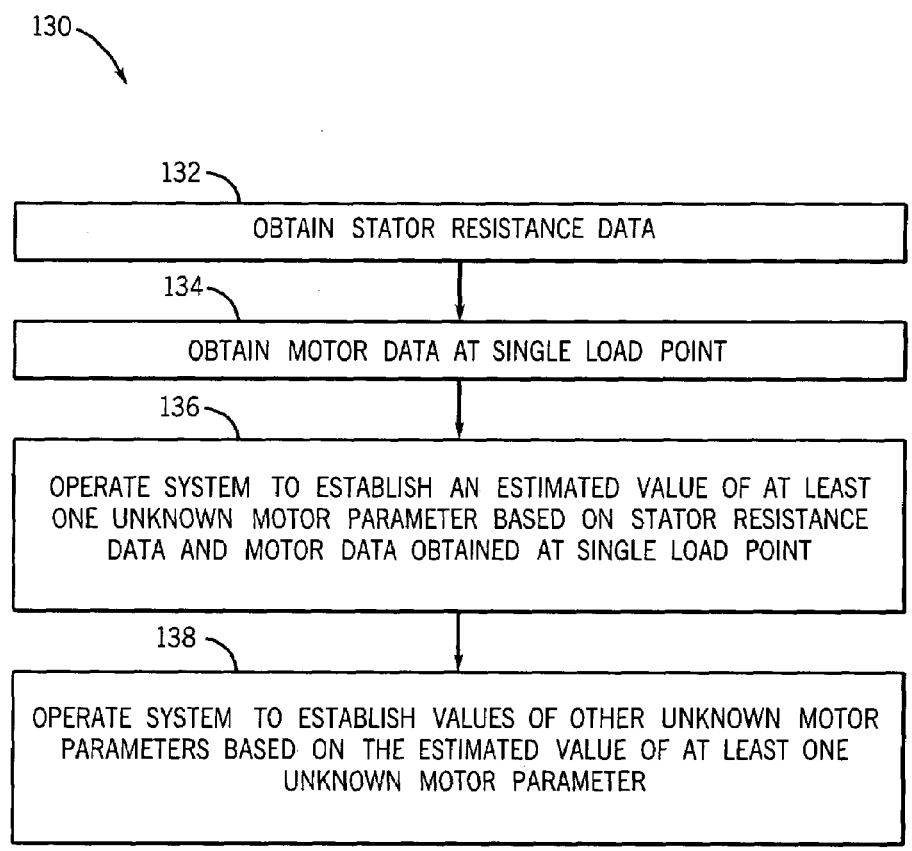
FIG. 7 is another alternative process for providing estimated values of various motor operating parameters based on data obtained at a single load on the motor, according to an exemplary embodiment of the present technique.

Referring generally to FIG. 7, a process for establishing values of various motor electrical parameters and various motor operating parameters using the system of FIG. 3 is shown and designated generally by reference numeral 130. The process comprises obtaining the resistance of the stator, as represented by block 132. The process also comprises obtaining data at a single operating load point and providing the data to the processor module 84, as represented by block 134. In a presently contemplated embodiment, the data obtained at the first load point comprises: input voltage data, input current data, input power data, shaft speed data, and stator temperature data. It should be noted that the input power can either be measured or calculated from the other input data. Some data may be provided to the system 80 using the control module 90 or may be provided from a remote station 98 via the network 96.

As represented by block 136, the data processing module 82 then operates to establish estimated values of various motor parameters. As discussed above, these estimated motor parameters may comprise one or more of the circuit parameters in the motor equivalent circuits 50 and 110 illustrated in FIGS. 2 and 5. Accordingly, the various motor parameters may comprise the stator resistance $R_1$, the slip s, the stator leakage reactance $X_1$, the rotor resistance $R_2$, the rotor leakage reactance $X_2$, the core loss resistance $R_c$, and the magnetizing reactance $X_m$. The stator resistance $R_1$ and the motor slip s can be measured relatively easily, while the remaining parameters (i.e., $X_1$, $R_2$, $X_2$, $R_c$, and $X_m$) are estimated by the processor module 84 in accordance with unique aspects of the process 130 illustrated in FIG. 7.

As represented by block 138, the data processing module 82 then operates to establish estimated values of other unknown motor parameters based on the one or more parameters estimated in block 136. For example, the data processing module 82 may estimate output power, efficiency, torque, and other characteristics of the motor 20. Accordingly, in certain embodiments, the data processing module 82 operates in accordance with the process 130 to obtain various losses associated with the motor 20. For example, the losses may comprise stator loss, rotor loss, core loss, friction and windage, and stray load loss. The stator loss can be estimated accurately by measuring the stator resistance $R_1$ and the stator current $I_1$. The friction and windage loss can be estimated using simulated data on different motor sizes. For example, the data processing module 82 can access a database of motors to obtain the appropriate friction and windage loss. An exemplary motor database may list the motor frame size, number of poles, fan diameter, and the loss associated with the motor. The stray load loss can be estimated using the IEEE standard. Finally, data processing module 82 estimates the rotor loss and the core loss, as described in further detail below.

The rotor loss can be estimated approximately by multiplying the input power minus the stator loss by the slip, as follows:

$$\text{RotorLoss} = (P_{in} - 3I_1^2 R_1)s \quad (64)$$

$P_{in}$ is the input power in watts, $I_1$ is the input current, $R_1$ is the stator phase resistance, and s is the slip of the rotor. As discussed above with reference to FIG. 7, these parameters are obtained in blocks 132 and 134 of the process 130. Accordingly, the data processing module 82 readily estimates the rotor loss according to equation (64). The error in estimating the rotor loss using this method is equal to the slip s multiplied by the core loss. In view of the equivalent circuit 50 of FIG. 2, the core loss can be expressed as follows:

$$\text{CoreLoss} = \frac{3V_a^2}{R_c} \quad (65)$$

$V_a$ is the voltage across the rotor and $R_c$ is the core loss resistance. Accordingly, the error associated with the rotor loss calculated above in equation (64) can be expressed as follows:

$$\text{Rotor Loss Error} = \frac{3V_a^2}{R_c} s \quad (66)$$

The foregoing calculation provides an accurate estimation of rotor loss for motors having low to moderate core loss (e.g., less than 50% of the total losses). For example, if the core loss (65) is roughly 20% of the losses, then a motor having 85% efficiency will have a core loss of approximately the 3% of the input power. If the motor has four poles and a 40-rpm slip at full load, then the slip s will be approximately 0.0227. Applying these values to equation (66), the percentage error in rotor loss is equal to 0.068% of input power. Accordingly, the rotor loss error (66) has a negligible effect on the calculation of rotor loss (64) and motor efficiency, as discussed in further detail below.

The only loss left to be estimated is the core loss. For this estimated motor parameter, the data processing module 82 operates to calculate the various parameters of the equivalent circuits 50 and 110, as illustrated in FIGS. 2 and 5. In the illustrated embodiment of FIG. 7, the data processing module 82 operates to obtain or estimate the various parameters: $R_1$, s, $X_1$, $R_2$, $X_2$, $R_c$, and $X_m$. The calculation of the stator resistance $R_1$ and the motor slip s can be obtained relatively easily. However, the data processing module 82 estimates the remaining parameters (i.e., $X_1$, $R_2$, $X_2$, $R_c$, and $X_m$) using unique aspects of the process 130, as set forth below. Once all circuit parameters are obtained, the data processing module 82 estimates the core loss. In turn, the data processing module 82 can estimate other operating parameters of the motor, such as motor efficiency, torque, and so forth.

As discussed above, the process 130 comprises several assumptions and approximations to simplify the process of estimating $X_1$, $R_2$, $X_2$, $R_c$, and $X_m$. For example, the frequency of the power is assumed to be constant, the speed of the rotor is assumed to be constant during the gathering of the single load point data, and the rotor temperature is assumed to be constant during the gathering of the data. Additionally, it has been shown that the stator leakage reactance $X_1$ can be expressed as a fraction of the magnetizing reactance $X_m$ using the following equation:

$$X_1 = 0.0325 X_m \quad (67)$$

As discussed above, this factor may range from 0.02 to 0.07.

According to the IEEE standard, the rotor leakage reactance $X_2$ can be expressed as a function of the stator leakage reactance $X_1$ as follows:

For design A motors: $X_2 = X_1$ \quad (68)

For design B motors: $X_2 = 1.492 X_1$ \quad (69)

For design C motors: $X_2 = 2.325 X_1$ \quad (70)

For design D motors: $X_2 = X_1$ \quad (71)

Accordingly, the calculation of rotor leakage reactance $X_2$ provided by equations (68) through (71) depends on the calculation of stator leakage reactance $X_1$ provided by equation (67), which in turn depends on the calculation of magnetizing reactance $X_m$. The magnetizing reactance $X_m$ is estimated by the data processing module 82, as set forth below.

In view of the simplified motor equivalent circuit 110 illustrated in FIG. 5, the data processing module 82 estimates an approximate value of equivalent resistance $X_e$ using the following equations relating the measured input current, voltage and power:

$$\text{Real Part of Input Impedance } Z_{inR} = \frac{V_{inR}}{I_1} \quad (72)$$

$$\text{Imaginary Part of input Impedance } Z_{inI} = \frac{V_{inI}}{I_1} \quad (73)$$

$$X_e = (Z_{inI} - X_1) + \frac{(Z_{inR} - R_1)^2}{(Z_{inI} - X_1)} \quad (74)$$

$V_{inR}$ is the real portion of the input voltage, $V_{in1}$ is the imaginary portion of the input voltage, $I_1$ is the electric current through the stator, $R_1$ is the stator resistance, and $X_1$ is the stator leakage reactance. The data processing module 82 also defines the parallel resistive element or total resistance $R_t$, as set forth in the following equation:

$$R_t = (Z_{inR} - R_1) + \frac{(Z_{inI} - X_1)^2}{(Z_{inR} - R_1)} \quad (75)$$

In this exemplary embodiment, the data processing module 82 initially assumes the stator leakage reactance $X_1$ equal to zero to estimate a first approximation of the equivalent resistance $X_e$, as set forth below:

$$X_e \text{ (approximate)} = Z_{inI} + \frac{(Z_{inR} - R_1)^2}{Z_{inI}} \quad (76)$$

In view of the relationships set forth above in equations (67) through (76), the data processing module 82 estimates an approximate value for the stator leakage reactance $X_1$ as a fraction of the first approximation of the equivalent resistance $X_e$, as follows:

$$X_1\text{(approximate)} = 0.0325 X_e\text{ (approximate)} \quad (77)$$

Again, this factor may range from 0.02 to 0.07. After calculating an approximate value for the stator leakage reactance $X_1$ as set forth by equation (77), the data processing module 82 can estimate the rotor leakage reactance $X_2$ using the appropriate one of equations (68) through (71). Accordingly, only the rotor resistance $R_2$, the core loss resistance $R_c$, and the magnetizing reactance $X_m$ remain to be estimated by the data processing module 82.

In the illustrated embodiment of FIG. 7, data processing module 82 estimates the rotor resistance $R_2$ using the following relationships:

$$R_2 = \frac{3V_a^2 s^2}{RotorLoss} \quad (78)$$

Again, $V_a$ is the voltage across the rotor, s is the slip of the rotor, and the rotor loss is estimated according to equation (64). The rotor voltage $V_a$ can be calculated from the real and imaginary parts $V_{aR}$ and $V_{aI}$ of the rotor voltage $V_a$, as set forth in the following equations:

$$V_{aR} = V_{1R} - I_1 R_1 \quad (79)$$

$$V_{aI} = V_{1I} - I_1 X_1 \quad (80)$$

$$V_a = (V_{aR}^2 + V_{aI}^2)^{1/2} \quad (81)$$

After calculating the rotor voltage $V_a$, the data processing module 82 proceeds to calculate the rotor resistance defined by equation (77). Accordingly, only the core loss resistance $R_c$ and the magnetizing reactance $X_m$ remain to be estimated by the data processing module 82.

The data processing module 82 can calculate the magnetizing reactance $X_m$ and that core loss resistance $R_c$ from the following relationships:

$$\frac{1}{X_e} = \frac{1}{X_m} + \frac{1}{X_2 + \frac{R_2^2}{X_2}} \quad (82)$$

$$\frac{1}{R_t} = \frac{1}{R_c} + \frac{1}{\frac{R_2}{S} + \frac{X_2^2}{\frac{R_2}{S}}} \quad (83)$$

Finally, using the core loss resistance $R_c$ calculated from equation (83), the processing module 82 can calculate the core loss defined by equation (65).

At this point, the data processing module 82 has estimated values for all of the motor parameters (e.g., $X_1$, $R_2$, $X_2$, $R_c$, and $X_m$) and all the motor losses (e.g., stator loss, rotor loss, core loss, friction and windage loss, and stray load loss). If desired, after calculating the magnetizing reactance $X_m$ as set forth in equation (82), the data processing module 82 can recalculate the stator leakage reactance $X_1$ according to equation (67). In turn, the data processing module 82 can recalculate the other motor parameters (e.g., $R_2$, $X_2$, $R_c$, and $X_m$) and the core loss using the newly estimated value of stator leakage reactance $X_1$. Accordingly, the data processing module 82 can reiterate the calculations set forth in equations (67) through (83) any number of times to improve the accuracy of the estimated motor parameters.

After obtaining final estimations of these motor parameters and losses, the data processing module 82 can proceed to estimate motor operating parameters, such as motor efficiency, torque, and so forth (block 138). For example, the system may be adapted to calculate the rotor torque, the rotor temperature, and the motor efficiency based on the values of $R_2$, $X_2$, $R_c$, and $X_m$, electrical input data, and rotor speed data. As discussed above, the shaft torque may be obtained from the rotor resistance $R_2$ and the rotor current $I_2$ as set forth in equation (24). In addition, the motor efficiency can be estimated from the following equation:

$$\eta = \frac{P_{out}}{P_{in}} = \frac{P_{in} - SL - RL - CL - FWL - SLL}{P_{in}} \quad (84)$$

SL is the stator loss, RL is the rotor loss estimated above in equation (64), CL is the core loss estimated above in equation (65), FWL is the friction and windage loss, and SLL is the stray load loss.

The process 130 described above with reference to FIG. 7 provides an exceptional estimation of the motor parameters, motor losses, and the motor efficiency. These estimations are particularly accurate if the core loss moderate to low, e.g., less than 50% of the total motor losses. The reason for this correlation between accuracy and core loss is due to the assumption of zero core loss in the estimation of rotor loss, rotor resistance $R_2$, and core loss resistance $R_C$. In the illustrated embodiment of FIG. 7, the magnitude of the core loss resistance $R_C$ relates to the addition of the rotor leakage reactance $X_2$. Accordingly, the value of the rotor leakage reactance $X_2$ results in a different core loss resistance $R_C$.

As an example of the accuracy of the single load point techniques described above, the process 130 was used to estimate the efficiency of a 60 HP motor. The actual efficiency of the motor is 94.4%, whereas the process 130 estimated the motor efficiency as 94% using a single load point. In addition, a TENV 75 HP motor (design B) was evaluated using both the two load points and single load point techniques described with reference to FIGS. 4 and 7. The motor efficiency estimated according to the two load points technique was 90.6%, while the single load point technique yielded a motor efficiency of 91.6%. The single load point technique of FIG. 7 estimated motor efficiencies based on the high load point and different reactance ratios $X_2/X_1$, i.e., 1.5, 2, 2.5, and 3, as tabulated below:

| Reactance Ratio | Core Resistance Ohm | Efficiency |
|---|---|---|
| 1.5 | 316 | 91.6 |
| 2 | 158 | 90.7 |
| 2.5 | 90.6 | 89.26 |
| 3 | 56.1 | 87.25 |
| Zero Core Loss Max Eff. | Infinity | 92.6 |

At a reactance ratio of 1.5, the motor efficiency estimated by the single point technique of FIG. 7 is approximately 1% higher than the motor efficiency estimated by the two point technique of FIG. 4. Accordingly, it can be concluded that the single point technique of FIG. 7 estimates the motor efficiency at an accuracy of 98%, because the accuracy of the two point technique of FIG. 4 has been established at approximately 99%. As a result, the single point technique of FIG. 7 can provide a range of motor efficiencies by estimating the maximum efficiency based on zero core loss and a lower bound using a leakage reactance ratio of 2.5.

Figure 8:
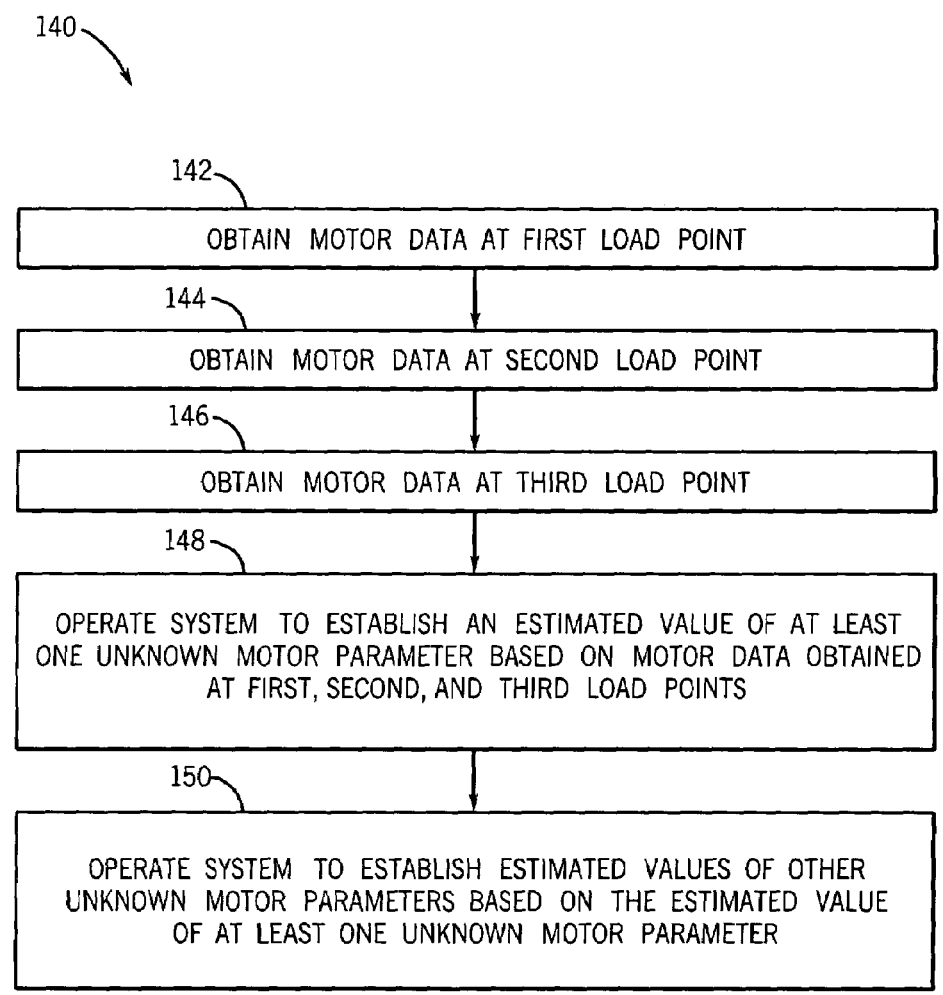
FIG. 8 is further alternative process for providing estimated values of various motor operating parameters based on data obtained at first, second, and third loads on the motor, according to an exemplary embodiment of the present technique.

Referring generally to FIG. 8, a process for establishing values of various motor electrical parameters and various motor operating parameters using the system of FIG. 3 is shown and designated generally by reference numeral 140. The process comprises obtaining data at a first operating load point and providing the data to the processor module 84, as represented by block 142. The process also comprises obtaining data at a second operating load point and providing the data to the processor module 84, as represented by block 144. The process further comprises obtaining data at a third operating load point and providing the data to the processor module 84, as represented by block 146. In a presently contemplated embodiment, the data obtained at the first, second, and third load points comprises: input voltage data, input current data, input power data, shaft speed data, and frequency of the motor 20. It should be noted that the input power can either be measured or calculated from the other input data. In addition, the process may measure motor temperature. However, the data obtained at these three points generally does not include the stator resistance of the motor 20. Some data may be provided to the system 80 using the control module 90 or may be provided from a remote station 98 via the network 96.

As represented by block 148, the data processing module 82 then operates to establish estimated values of various motor parameters without the need to measure the stator resistance. As discussed above, these estimated motor parameters may comprise one or more of the circuit parameters in the motor equivalent circuits 50 and 110 illustrated in FIGS. 2 and 5. Accordingly, the various motor parameters may comprise the stator resistance $R_1$, the slip s, the stator leakage reactance $X_1$, the rotor resistance $R_2$, the rotor leakage reactance $X_2$, the core loss resistance $R_c$, and the magnetizing reactance $X_m$. These seven parameters determine the motor equivalent circuit 50. Accordingly, the motor equivalent circuit 50 can be fully analyzed by measuring and/or estimating these parameters. The motor slip s can be calculated based on the speed of the motor, which is obtained in blocks 142, 144, and 146. The remaining parameters (i.e., $R_1$, $X_1$, $R_2$, $X_2$, $R_c$, and $X_m$) are estimated by the processor module 84 in accordance with unique aspects of the process 140 illustrated in FIG. 8.

As represented by block 150, the data processing module 82 then operates to establish estimated values of other unknown motor parameters based on the one or more parameters estimated in block 148. For example, the data processing module 82 may estimate output power, efficiency, torque, and other characteristics of the motor 20. In addition, in certain embodiments, the data processing module 82 operates in accordance with the process 140 to obtain various losses associated with the motor 20. For example, the losses may comprise stator loss, rotor loss, core loss, friction and windage, and stray load loss. Based on these losses, the data processing module 82 can then estimate the motor efficiency.

To estimate the six unknown motor parameters, the process 140 of FIG. 8 proceeds to solve six equations relating to measurements of the input voltage, current, power, and output speed at the three load points. In view of the motor equivalent circuit 50 of FIG. 2, the input impedance at three load points may be defined by the following equations:

$$Z_{in1} = Z_s + \frac{Z_c Z_{r1}}{Z_c + Z_{r1}} \tag{85}$$

$$Z_{in2} = Z_s + \frac{Z_c Z_{r2}}{Z_c + Z_{r2}} \tag{86}$$

$$Z_{in3} = Z_s + \frac{Z_c Z_{r3}}{Z_c + Z_{r3}} \tag{87}$$

$Z_s$ is the stator impedance, $Z_c$ is of the core impedance, and $Z_r$ is the rotor impedance. These three input impedance equations can be combined by subtracting equation (86) from equation (85), subtracting equation (87) from equation (85), and dividing the resulting two equations to obtain the following:

$$\frac{(Z_{in1} - Z_{in2})(Z_c + Z_{r2})}{(Z_{in1} - Z_{in3})(Z_c + Z_{r3})} = \frac{(Z_{r1} - Z_{r2})}{(Z_{r1} - Z_{r3})} \tag{88}$$

In addition, given that the rotor leakage inductance $L_2$ and the rotor resistance $R_2$ are the same at each of the three load points, the right hand side of equation (88) can be simplified to the following equation:

$$\lambda = \frac{\left(\frac{1}{S_1} - \frac{1}{S_2}\right)}{\left(\frac{1}{S_1} - \frac{1}{S_3}\right)} \tag{89}$$

$S_1$, $S_2$, and $S_3$ are the motor slips at the three load points. As discussed above, these motor slips $S_1$, $S_2$, and $S_3$ can be calculated from speed measurements obtained in blocks 142, 144, and 146 of the process 140. Denoting the quantity in equation (89) by $\lambda$, the foregoing equation (88) can be solved for core impedance $Z_c$ in terms of the rotor imped ance $Z_r$ at load points 2 and 3 as set forth in the following equation:

$$Z_c = \frac{(Z_{in1} - Z_{in2})Z_{r2} - \lambda(Z_{in1} - Z_{in3})Z_{r3}}{[\lambda(Z_{in1} - Z_{in3}) - (Z_{in1} - Z_{in2})]} \quad (90)$$

The core impedance $Z_c$ defined by equation (90) can then be substituted into equation (88) to obtain an equation in the rotor input impedances $Z_{r1}$, $Z_{r2}$ and $Z_{r3}$ at the first, second, and third load points. These rotor input impedances $Z_{r1}$, $Z_{r2}$ and $Z_{r3}$ are functions of the rotor leakage reactance $X_2$ and the motor resistance $R_2$. The resulting equation can be decomposed into a real part and an imaginary part yielding two equations in the two rotor unknowns. The rotor impedance $Z_r$ can be expressed as:

$$Z_r = \frac{R_2}{S} + jX_2 \quad (91)$$

Using equation (91) at the three load points yields the rotor impedance $Z_r$ at the three different slips $S_1$, $S_2$, and $S_3$. After the foregoing substitution of the core impedance $Z_c$ decomposition into real and imaginary parts, equation (88) can be redefined as set forth below:

The real part is given by:

$$\left(\frac{A_{22}}{S_2^2} + \frac{A_{33}}{S_3^2} + \frac{A_{12}}{S_1 S_2} + \frac{A_{13}}{S_1 S_3} + \frac{A_{23}}{S_2 S_3}\right)R_2^2 - \quad (92)$$
$$(A_{22} + A_{33} + A_{12} + A_{13} + A_{23})X_2^2 - \left[\frac{2B_{22}}{S_2} + \frac{2B_{33}}{S_3} + \right.$$
$$\left.\left(\frac{1}{S_1} + \frac{1}{S_2}\right)B_{12} + \left(\frac{1}{S_1} + \frac{1}{S_3}\right)B_{13} + \left(\frac{1}{S_2} + \frac{1}{S_3}\right)B_{23}\right]R_2 X_2 = 0$$

The imaginary part is given by:

$$\left(\frac{B_{22}}{S_2^2} + \frac{B_{33}}{S_3^2} + \frac{B_{12}}{S_1 S_2} + \frac{B_{13}}{S_1 S_3} + \frac{B_{23}}{S_2 S_3}\right)R_2^2 - \quad (93)$$
$$(B_{22} + B_{33} + B_{12} + B_{13} + B_{23})X_2^2 + \left[\frac{2A_{22}}{S_2} + \frac{2A_{33}}{S_3} + \right.$$
$$\left.\left(\frac{1}{S_1} + \frac{1}{S_2}\right)A_{12} + \left(\frac{1}{S_1} + \frac{1}{S_3}\right)A_{13} + \left(\frac{1}{S_2} + \frac{1}{S_3}\right)A_{23}\right]R_2 X_2 = 0$$

The A's and the B's in equations (92) and (93) are functions of the measured input impedance at the three load points and, also, the rotor resistance $R_2$.

As set forth below in detail below, these two equations (92) and (93) can be simplified as:

$$(M_1 + M_2 R_2)R_2^2 + (N_1 + N_2 R_2)X_2^2 + (L_1 + L_2 R_2)R_2 X_2 = 0 \quad (94)$$

$$(U_1 + U_2 R_2)R_2^2 + (V_1 + V_2 R_2)X_2^2 + (W_1 + W_2 R_2)R_2 X_2 = 0 \quad (95)$$

Equation (95) essentially obtains the rotor leakage reactance $X_2$ in terms of the rotor resistance $R_2$. The A's and B's can be defined by the following equations in which $\beta_R$ and $\beta_j$ are the real and imaginary parts of the measured differential input impedance $\beta_1$ and $\beta_2$ and the subscripts 1, 2, and 3 refer to the first, second, and third load points obtained at blocks 142, 144, and 146 of the process 140 of FIG. 7.

$$A_{22} = (\beta_{1R}^2 - \beta_{1j}^2)\left(\left(\frac{1}{S_2} - \frac{1}{S_1}\right)R_2 + \lambda\beta_{2R}\right) - 2\beta_{1R}\beta_{1j}\beta_{2j}\lambda \quad (96)$$

$$\beta_1 = Z_{in1} - Z_{in2} \quad (97)$$

$$\beta_2 = Z_{in1} - Z_{in3} \quad (98)$$

$$A_{33} = \lambda^2\left[(\beta_{2R}^2 - \beta_{2j}^2)\left(\left(\frac{1}{S_2} - \frac{1}{S_1}\right)R_2 + \beta_{1R}\right) - 2\beta_{2R}\beta_{2j}\beta_{1j}\right] \quad (99)$$

$$A_{12} = \begin{bmatrix} (\beta_{1R}\beta_{2R} - \beta_{1j}\beta_{2j})(\lambda^2\beta_{2R} - \lambda\beta_{1R}) - \\ (\beta_{1R}\beta_{2j} + \beta_{1j}\beta_{2R})(\lambda^2\beta_{2j} - \lambda\beta_{1j}) \end{bmatrix} \quad (100)$$

$$A_{13} = -A_{12} \quad (101)$$

$$A_{23} = -\begin{bmatrix} (\beta_{1R}\beta_{2R} - \beta_{1j}\beta_{2j})(\lambda\beta_{1R} + \lambda^2\beta_{2R} + 2R_2\left(\frac{1}{S_1} - \frac{1}{S_2}\right)) - \\ (\beta_{1R}\beta_{2j} + \beta_{1j}\beta_{2R})(\lambda\beta_{1j} + \lambda^2\beta_{2j}) \end{bmatrix} \quad (102)$$

$$B_{22} = \lambda\beta_{2j}(\beta_{1R}^2 - \beta_{1j}^2) + 2\beta_{1R}\beta_{1j}\left(\left(\frac{1}{S_2} - \frac{1}{S_1}\right)R_2 + \lambda\beta_{2R}\right) \quad (103)$$

$$B_{33} = \lambda^2\left[\beta_{1j}(\beta_{2R}^2 - \beta_{2j}^2) + 2\beta_{2R}\beta_{2j}\left(\left(\frac{1}{S_2} - \frac{1}{S_1}\right)R_2 + \beta_{1R}\right)\right] \quad (104)$$

$$B_{12} = \begin{bmatrix} (\beta_{1R}\beta_{2j} + \beta_{1j}\beta_{2R})(\lambda^2\beta_{2R} - \lambda\beta_{1R}) + \\ (\beta_{1R}\beta_{2R} - \beta_{1j}\beta_{2j})(\lambda^2\beta_{2j} - \lambda\beta_{1j}) \end{bmatrix} \quad (105)$$

$$B_{13} = -B_{12} \quad (106)$$

$$B_{23} = -\begin{bmatrix} (\beta_{1R}\beta_{2R} - \beta_{1j}\beta_{2j})(\lambda\beta_{1j} + \lambda^2\beta_{2j}) + \\ (\beta_{1R}\beta_{2j} + \beta_{1j}\beta_{2R})\left(\lambda\beta_{1R} + \lambda^2\beta_{2R} + 2R_2\left(\frac{1}{S_1} - \frac{1}{S_2}\right)\right) \end{bmatrix} \quad (107)$$

In turn, an equation (108) can be achieved by dividing equations (94) and (95) by the square of the rotor leakage reactance $$X_2^2$$

and by defining $\alpha = R_2/X_2$ (i.e., the ratio of rotor resistance $R_2$ to rotor leakage reactance $X_2$), as set forth below:

$$\alpha = \frac{(W_1 + W_2 R_2)(N_1 + N_2 R_2) - (L_1 + L_2 R_2)(V_1 + V_2 R_2)}{(M_1 + M_2 R_2)(V_1 + V_2 R_2) - (N_1 + N_2 R_2)(U_1 + U_2 R_2)} \quad (108)$$

In view of the equations set forth above, the rotor leakage reactance $X_2$ can be obtained in terms of the rotor resistance $R_2$ based on equation (95). The rotor leakage reactance $X_2$ from equation (108) can then be substituted into the equation (94). This substitution yields a cubic equation in the rotor resistance $R_2$. Using a spreadsheet, it was found that the foregoing equation reduces to a quadratic equation in the rotor resistance $R_2$. Accordingly, after solving for the rotor resistance $R_2$, the rotor leakage reactance $X_2$ can be obtained using equation (108). In turn, the core impedance $Z_c$ can be obtained using equation (90). Moreover, the stator impedance can then be obtained using equation (85). If desired, the data processing module 82 can calculate other parameters based on the foregoing calculations. For example, the data processing module 82 uses these estimated parameters to estimate the efficiency of the motor 20.

The process 140 described above with reference to FIG. 8 was evaluated with data obtained at three load points on a real motor. The process 140 provided exceptionally accurate estimations of motor efficiency. Numerical analysis and the foregoing tests indicated an estimation error of approximately 1.5% as it pertains to the estimation of motor efficiency. A portion of this error can be attributed to inaccuracies encountered in the field due to instrumentation.

Figure 9:
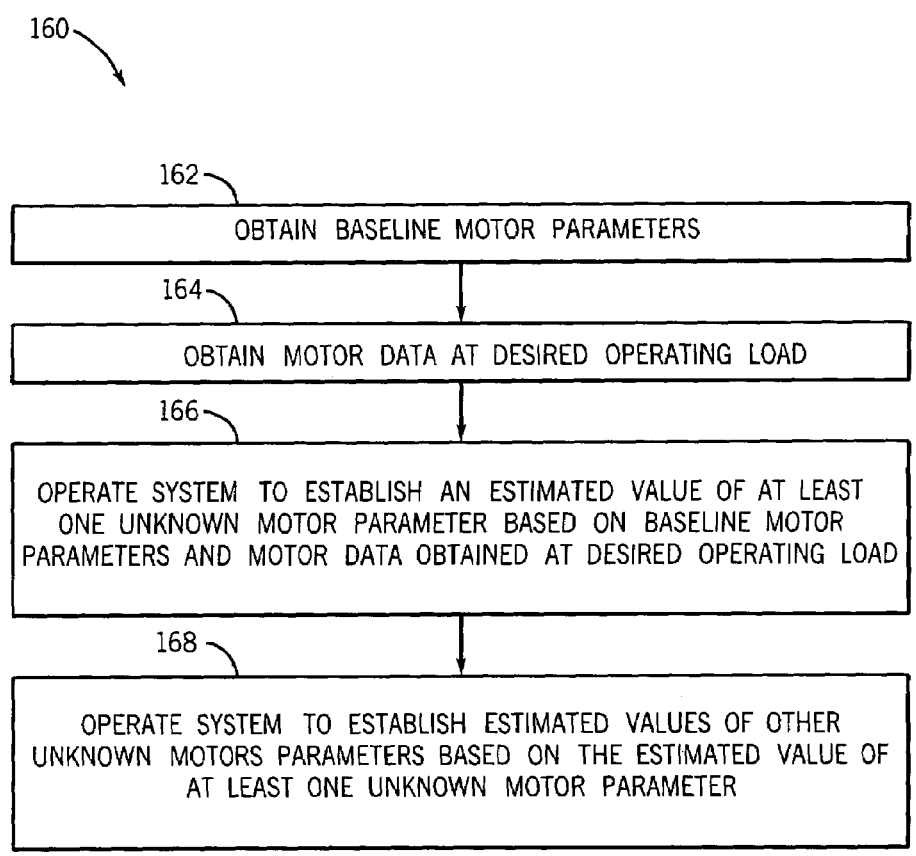
FIG. 9 is another alternative process for providing estimated values of various motor operating parameters based on baseline motor parameters and data obtained at a desired operating load on the motor, according to an exemplary embodiment of the present technique.

Referring generally to FIG. 9, a process for establishing values of various motor electrical parameters and various motor operating parameters, such as motor torque and speed, is shown and designated generally by reference numeral 160. The process 160 comprises obtaining baseline motor parameters and providing the data to the processor module 84, as represented by block 162. For example, the data processing module 82 may obtain the various parameters for the motor equivalent circuits 50 and 110 of FIGS. 2 and 5 at a particular baseline condition. In certain embodiments, as described below, the baseline condition may comprise a motor frequency (e.g., 60 Hz) for an inverter-driven motor. If desired, the process 160 may employ any one of the processes 100, 120, 130, or 140 described above with reference to FIGS. 4, 6, 7, and 8. The process 160 also comprises obtaining motor data at a desired operating load point or condition (e.g., a new motor frequency other than baseline) and providing the data to the processor module 84, as represented by block 164. In a presently contemplated embodiment, the data obtained at the desired operating load comprises: input voltage data, input current data, input power data, shaft temperature data, and frequency data of the motor 20. It should be noted that the input power can either be measured or calculated from the other input data. In addition, the data obtained at these three points generally does not include the speed and/or torque of the motor 20. Some data may be provided to the system 80 using the control module 90 or may be provided from a remote station 98 via the network 96.

As represented by block 166, the data processing module 82 then operates to establish estimated values of various motor parameters at the desired operating load based on the baseline motor parameters and the data obtained at the desired operation load. Again, this estimation step 166 may be performed without measurements of the speed and/or torque of the motor 20. As discussed above, these estimated motor parameters may comprise one or more of the circuit parameters in the motor equivalent circuits 50 and 110 illustrated in FIGS. 2 and 5. Accordingly, the various motor parameters may comprise the stator resistance $R_1$, the slip s, the stator leakage reactance $X_1$, the rotor resistance $R_2$, the rotor leakage reactance $X_2$, the core loss resistance $R_c$, and the magnetizing reactance $X_m$. These seven parameters determine the motor equivalent circuit 50. Accordingly, the motor equivalent circuit 50 can be fully analyzed by measuring and/or estimating these parameters. As discussed below, the data processing model 82 estimates these parameters in accordance with unique aspects of the process 160 illustrated in FIG. 9.

As represented by block 168, the data processing module 82 then operates to establish estimated values of other unknown motor parameters based on the one or more parameters estimated in block 166. For example, the data processing module 82 may estimate output power, speed, efficiency, torque, and other characteristics of the motor 20. In addition, in certain embodiments, the data processing module 82 operates in accordance with the process 160 to obtain various losses associated with the motor 20. For example, the losses may comprise stator loss, rotor loss, core loss, friction and windage, and stray load loss.

Returning to block 166, the process 160 estimates the stator leakage inductance $L_1$ and the rotor leakage inductance $L_2$ to be equal to the inductances obtained at the baseline condition. In this manner, the motor parameters $L_1$ and $L_2$ are assumed constant. Regarding resistances, the process 160 estimates the stator resistance $R_1$ and the rotor resistance $R_2$ as a function of temperature. For example, the stator resistance $R_1$ can be calculated based on the baseline temperature $T_{baseline}$, the baseline stator resistance $R_{baseline}$, and the current stator temperature T at the desired operating load, as set forth below:

$$R = \frac{(234.5 + T)}{(234.5 + T_{baseline})} R_{baseline} \quad (109)$$

Accordingly, only three unknown motor parameters remain to be estimated by the process 160.

The series core loss resistance $R_m$ can be calculated according to the following equation:

$$R_m = R_{m60}\left(.8\left(\frac{f}{60}\right) + .2\left(\frac{f}{60}\right)^2\right) \quad (110)$$

In the above equation (110), f is the input frequency and $R_{m60}$ is the series core loss resistance, which is known at the baseline condition of the motor. For example, in this particular embodiment, the series core loss resistance $R_{m60}$ corresponds to a baseline input frequency of 60 Hz. Accordingly, only two unknown motor parameters (i.e., $L_m$, and s) remain to be estimated by the process 160.

To estimate the two unknown motor parameters, the process 160 of FIG. 9 proceeds to solve two equations using the baseline motor parameters and the data obtained at the desired operating load (e.g., input current, voltage, power, and frequency). Based on the measurement of input current, the input current complex value can be calculated as set forth below:

$$I_{in} = I_{inR} + jI_{inI} \quad (111)$$

Subscripts R and I represent the real and imaginary parts of the input current $I_{in}$. Using the equivalent circuit of the induction motor, the process 160 can express the input current $I_{in}$ in terms of the motor input phase voltage and the equivalent circuit impedance. First, the input impedance can be expressed as:

$$Z_{in} = Z_{inR} + jZ_{inI} \quad (112)$$

In real and imaginary parts, the process 160 can express the input impedance of equation (112) as follows:

$$Z_{in} = \frac{\begin{bmatrix} [R_1(R_2/s + R_m) - X_1(X_2 + X_m)] + \\ j[R_1(X_2 + X_m) + X_1(R_2/s + R_m)] \end{bmatrix}}{(R_2/s + R_m) + j(X_2 + X_m)} \quad (113)$$

Accordingly, in terms of the input phase voltage and input impedance, the process 160 can express the input current $I_{in}$ as set forth below:

$$I_{in} = \frac{V}{Z_{inR} + jZ_{inI}} \quad (114)$$

In turn, the process 100 can express the foregoing equation (114) as set forth in the following equation:

$$I_{inR} + jI_{inI} = V\left(\frac{Z_{inR}}{Z_{inR}^2 + Z_{inI}^2}\right) - jV\left(\frac{Z_{inI}}{Z_{inR}^2 + Z_{inI}^2}\right) \quad (115)$$

In view of the baseline parameters and the data and parameters at the desired operating load, the process 160 can equate the real parts and the imaginary parts on both sides of equation (115) to obtain two equations corresponding to the baseline and the desired operating load. Given that the only unknown parameters are the magnetizing reactance $X_m$ and the slip s, the process 160 can calculate the values of the magnetizing reactance $X_m$ and the slip s at the desired operating load. Using the calculated slip s and the measured frequency f, the process 160 can calculate the speed (e.g., rotations per minute) of the motor. In addition, the process 160 can calculate other motor operating parameters, such as torque, efficiency, output power, and so forth. For example, the motor torque can be calculated according to equation (24), as discussed above. Moreover, given that output power is related to the output speed times the torque, the process 160 can calculate the output power using the output torque and speed of the motor. The process 160 can then calculate the new motor efficiency as set forth in equation (26), as discussed above. In this manner, the process 160 facilitates the identification of motor operating parameters without implementing a speed sensor and/or a torque sensor.

Figure 10:
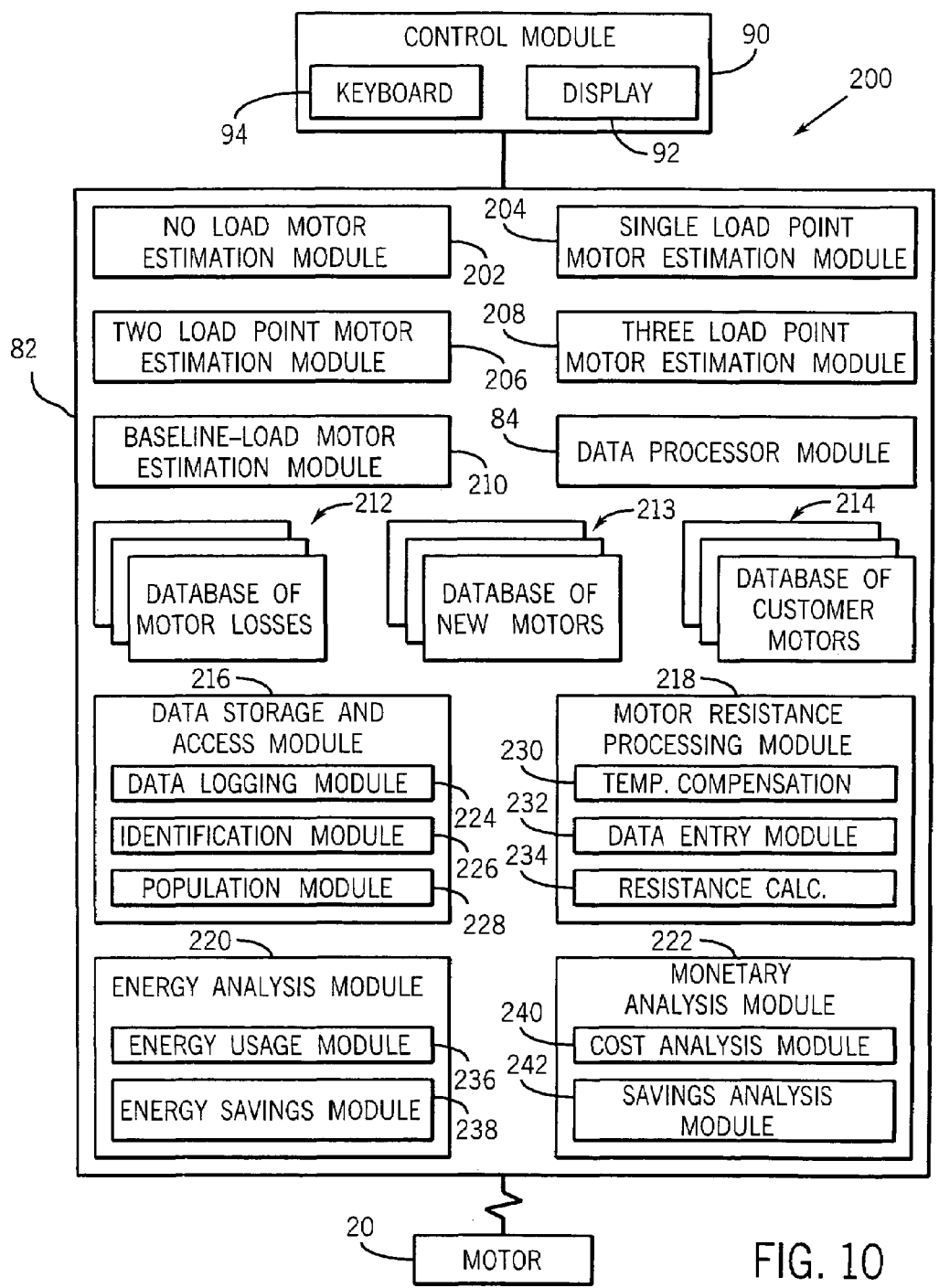
FIG. 10 is a system for providing estimated values of various motor operating parameters, according to an exemplary embodiment of the present technique.

Referring generally to FIG. 10, a system for establishing values of various motor electrical parameters and various motor operating parameters is shown and designated generally by reference numeral 200. As illustrated, the system 200 comprises the control module 90 and the data processing module 82, which can be separate or integral components of a variety of mobile or stationary systems, electronic devices, instruments, computers, software programs, circuit boards, and so forth. The illustrated embodiment of the data processing module 82 comprises a variety of modules or features to facilitate the estimation of electrical and operating parameters of the motor 20. Each of these modules may comprise software programs or components, hardware circuitry, and so forth. For example, the data processing module 82 may comprise one or more of the following features: a no-load motor estimation module 202, a single load point motor estimation module 204, a two load point motor estimation module 206, a three load point motor estimation module 208, a baseline-load motor estimation module 210, the data processor module 84, one or more databases of motor losses 212 (e.g., friction and windage loss database), one or more databases of new/replacement motors 213, one or more databases of customer motors 214, a data storage and access module 216, a motor resistance processing module 218, an energy analysis module 220, and/or a monetary analysis module 222. Although other features also may be incorporated into the data processing module 82 of system 200, the foregoing modules may be employed to provide exceptionally accurate estimations of electrical and operating parameters of the motor 20, as described below.

Regarding modules 202 through 210, the no-load motor estimation module 202 may comprise one or more of the various features described above with reference to the process 120 illustrated by FIG. 6. Similarly, the single load point motor estimation module 204 can have one or more of the features described above with reference to the process 130 illustrated by FIG. 7. With reference to FIG. 4, the two load point motor estimation module 206 may incorporate one or more of the features described above with reference to the process 100. The three load point motor estimation module 208 can employ one or more of the features described with reference to the process 140 illustrated by FIG. 8. Finally, the baseline-load motor estimation module 210 may comprise one or more of the various features described above with reference to the process 160 illustrated by FIG. 9.

Regarding the databases 212 through 214, the system 200 may store the information locally or remotely on one or more storage devices, computers, instruments, networks, and so forth. Accordingly, the databases 212 through 214 may be readily available on a local storage device or the system 200 may communicate with a remote device over a network, such as the network 96 illustrated by FIG. 3. Turning now to the specific databases, the database of motor losses and parameters 212 may comprise a variety of motor information, such as motor frame size, number of poles, fan diameter, and various losses associated with the motor. For example, the motor losses may comprise the friction and windage loss for various motors. Accordingly, the database 212 can be accessed and queried to obtain the desired data, such as the motor losses. For example, if the system 200 is estimating output power or operational efficiency, then the motor losses (e.g., friction and windage loss) can be obtained from the database 214 to facilitate a more accurate estimation of these operating parameters.

As discussed in further detail below, the database of new/replacement motors 213 can be used by the system 200 to evaluate and compare existing motors against the benefits of a new/replacement. For example, the database 213 may comprise a variety of operational parameters, such as motor efficiency, power usage, torque, space consumption, and so forth. Accordingly, the data processing module 82 may compare this motor data against estimated operational parameters of an old motor, such as the motor 20 being evaluated by the system 200.

The database have customer motors 214 also may comprise a variety of electrical and operational parameters for various motors. For example, each motor at a customer's site can be recorded in the database 214 according to motor efficiency, horsepower, application or use, location within the site, and various other features of the motor. In addition, the database 214 can store performance data taken at various times over the life of the motor, such that trends or changes in motor performance can be identified and addressed by customer. The database 214 also can be organized in various data sheets according to motor type, application, location, date of test, efficiency, and other features. Again, the particular data stored in the database 214 may comprise electrical parameters (e.g., resistances, inductances, etc.), operational parameters of the motor (e.g., efficiency, torque, etc.), power usage, time usage, costs, age, specification information, servicing, maintenance, testing, and so forth.

In addition to the databases, the illustrated system 200 comprises the data storage and access module 216, which has a data logging module 224, a data identification module 226, and a data population module 228. In operation, the data logging module 224 records various motor data and measurements, such as input current, voltage, frequency, power, time of measurement (e.g., date, clock time, and duration), speed, and other motor parameters. For example, the data logging module 224 may store test results according to a file name, a test time, and/or another identifying parameter (e.g., a motor speed). In turn, the data identification module 226 facilitates retrieval of the recorded data according to one or more identifying parameters. For example, if the system 200 engages one of the motor estimation modules 202 through 210, then the data storage access module 216 may utilize the data identification module 226 to identify the appropriate data for use in estimating motor parameters. In certain embodiments, this may involve data entry or selection of a filename, a testing time, a type of measurement, or another identifier. The data storage access module 216 can then engage the data population module 228, which retrieves the identified motor data and populates the appropriate fields with the motor data. For example, the data population module 228 may populate data fields in one of the motor estimation modules 202 through 210 with motor parameters corresponding to input voltage, current, frequency, power, and/or a variety of other motor data. The data population module 228 also may populate one or more visual forms, spreadsheets, formulas, and other functional or visual objects with the identified data. As a result, the data storage and access module 216 reduces errors associated with data logging, retrieval, and use by the system 200, while also improving the overall efficiency of the system 200 by automating these functions.

As illustrated, the motor resistance processing module 218 comprises a temperature compensation module 230, a data entry module 232, and a resistance calculation module 234. As described below, these modules 230, 232, and 234 facilitate automatic calculation of the motor resistance parameters based on various data input. In this manner, the motor resistance processing module 218 improves the efficiency of the system 200, reduces errors associated with motor resistance calculations, and improves the accuracy of the motor resistance values for use by the motor estimation modules 202 through 210. For example, the illustrated temperature compensation module 230 uses a baseline measurement of motor temperature and stator resistance to adjust the stator resistance as the motor temperature changes. In operation, the temperature compensation module 230 may employ the following relationship between stator resistance and temperature for copper:

$$R_{t2} = \frac{(234.5 + T_2)}{(234.5 + T_1)} R_{t1} \qquad (116)$$

In this equation (116), $T_1$ refers to the baseline motor temperature, $T_2$ refers to the current motor temperature, $R_{t1}$ refers to the baseline resistance of the stator, and $R_{t2}$ refers to the current temperature-compensated value of the stator resistance. The data entry module 232 also cooperates with the temperature compensation module 230 to obtain the baseline motor temperature $T_1$, the baseline stator resistance $R_{t1}$, and the current motor temperature $T_2$ to calculate the current resistance $R_{t2}$ according to equation (116). In addition, the resistance calculation module 234 comprises or more formulas or equations to facilitate the calculation of resistance (e.g., cable resistance) based on various motor data or parameters. For example, the resistance calculation module 234 may cooperate with the data entry module 232 to obtain a cable gauge, a number of cables for phase, a cable length, a cable temperature, and other desired parameters to calculate the desired motor resistance. As a result, the motor resistance processing module 218 reduces errors associated with user calculations, improves the overall efficiency of the system 200 by automating these calculations, and improves the accuracy of resistance values for use by the motor estimation modules 202 through 210.

Turning now to the energy and monetary analysis modules 220 and 222, the system 200 may engage these modules to evaluate the performance of the motor 20 and compare this performance against one or more new/replacement motors, such as those stored in the database of new/replacement motors 213. As illustrated, the energy analysis module 220 comprises an energy usage module 236 and an energy savings module 238. In operation, the energy usage module 236 calculates or estimates the overall energy usage of the motor 20, while the energy savings module 238 calculates or estimates any energy savings that may be obtained by replacing the existing motor 20 with a new/replacement motor. For example, the energy savings module 238 may evaluate a variety of motors having different levels of energy efficiency and other performance criteria. As a result, a customer can make an informed decision whether to replace the motor 20 with a new/replacement motor.

In addition, the monetary analysis module 222 may function cooperatively with or separately from the energy analysis module 220. In this exemplary embodiment, the monetary analysis module 222 comprises a cost analysis module 240 and a savings analysis module 242. For example, the cost analysis module 240 may calculate the monetary cost of the motor 20 based on the output power, the cost per kilowatt-hour, and the number of hours per week of operation of the motor 20. Similarly, the savings analysis module 242 may calculate the monetary cost of a new/replacement motor and then calculate the monetary difference between the new/replacement motor and the existing motor 20. As result, a customer can make an informed decision whether to replace the motor 20 with a new/replacement motor.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
a motor resistance processing module adapted to establish resistance data based on input data of the electric motor;
a motor estimation module adapted to establish estimated values of a plurality of electrical parameters of an electric motor based on electrical input data and cable resistance data;
a data storage and access module adapted to identify a motor test record according to at least one test identifier and to provide data from the motor test record to the motor estimation module; and
a result module adapted to output and/or store the estimated values of the plurality of electrical parameters established by the motor estimation module.

2. The system as recited in claim 1, wherein the motor resistance processing module comprises a temperature compensation module adapted to establish current resistance data based on current temperature data and baseline temperature and resistance data.

3. The system as recited in claim 1, wherein the motor resistance processing module comprises a cable resistance calculation module adapted to establish cable resistance data based on a cable gauge, a number of cables per phase, a cable length, and a cable temperature.

4. The system as recited in claim 3, wherein the data storage and access module comprises a data population module adapted to populate fields of the motor estimation module with input current, input voltage, and output speed of the electric motor.

5. The system as recited in claim 1, wherein the motor estimation module is operable to establish an estimated value of an operational performance parameter of the electric motor based on the estimated values of electrical parameters of the electric motor.

6. The system as recited in claim 1, comprising a visual display operable to provide a visual indication of at least one of the estimated values.

7. The system as recited in claim 1, comprising a keyboard operable to facilitate manual entry of motor data.

8. The system as recited in claim 1, comprising at least one database of motor data.

9. The system as recited in claim 8, wherein the at least one database comprises a customer motor database having operational data of customer motors, motor applications, and performance data of the customer motors.

10. The system as recited in claim 8, wherein the at least one database comprises a replacement motor database having operational data of alternative motors.

11. The system as recited in claim 8, wherein the at least one database comprises a motor loss database having power losses correlated with various parameters of the electric motor.

12. A system, comprising:
at least one database of motor data;
a data storage and access module adapted to identify data records in the at least one database;
a motor estimation module adapted to establish estimated values of a plurality of electrical parameters of an electric motor based on electrical input data and cable resistance data; and
a result module adapted to output and/or store the estimated values of the plurality of electrical parameters established by the motor estimation module;
wherein the at least one database comprises a replacement motor database having operational data of alternative motors.

13. The system as recited in claim 12, wherein the motor estimation module is operable to establish an estimated value of an operational performance parameter of the electric motor based on the estimated values of electrical parameters of the electric motor.

14. The system as recited in claim 12, comprising a visual display operable to provide a visual indication of at least one of the estimated values.

15. The system as recited in claim 12, comprising a keyboard operable to facilitate manual entry of motor data.

16. The system as recited in claim 12, wherein the at least one database comprises a customer motor database having operational data of customer motors, motor applications, and performance data of the customer motors.

17. The system as recited in claim 12, wherein the at least one database comprises a motor loss database having power losses correlated with various parameters of the electric motor.

18. The system as recited in claim 17, wherein the power losses comprise friction and windage losses correlated with various parameters of the electric motor.

19. The system as recited in claim 12, wherein the data storage and access module comprises a data logging module adapted to record the electrical input data into the data records for a desired test of the electric motor.

20. The system as recited in claim 12, wherein the data storage and access module comprises a data identification module adapted to identify a log of a desired test of the electric motor based on at least one test identifier.

21. The system as recited in claim 12, wherein the data storage and access module comprises a data population module adapted to populate fields of the motor estimation module with logged data for a desired test of the electric motor.

22. The system as recited in claim 21, wherein the logged data comprises the electrical input data and at least one operational parameter of the electric motor.

23. The system as recited in claim 22, wherein the electrical input data comprises input current, input voltage, and frequency of the electric motor.

24. The system as recited in claim 22, wherein the at least one operational parameter comprises an output speed of the electric motor.

25. A method of operating a motor having a rotor and a stator, comprising:
accessing at least one motor database;
providing an instrumentation system with electrical input data obtained during testing of the motor;
operating the instrumentation system to establish estimated values of a plurality of electrical parameters of the motor based at least partially on the motor database, the electrical input data, and cable resistance data; and
outputting and/or storing the estimated values of the plurality of electrical parameters established through operation of the instrumentation system;
wherein accessing comprises retrieving previous testing data for the motor.

26. The method as recited in claim 25, wherein accessing comprises retrieving friction and windage loss data for the motor.

27. The method as recited in claim 25, wherein retrieving previous testing data comprises obtaining the electrical input data and at least one operational parameter of the motor.

28. The method as recited in claim 25, wherein accessing comprises retrieving customer motor data logged for a particular customer.

29. The method as recited in claim 25, further comprising operating the instrumentation system to estimate at least one motor operating parameter based on the estimated values, the motor database, and the electrical input data.

30. A system, comprising:
at least one database of motor data, wherein the at least one database comprises a customer motor database having operational data of customer motors, motor applications, and performance data of the customer motors;
a data storage and access module adapted to identify data records in the at least one database;

a motor estimation module adapted to establish estimated values of a plurality of electrical parameters of an electric motor based on electrical input data and cable resistance data; and a result module adapted to output andlor store the estimated values of the plurality of electrical parameters established by the motor estimation module.

31. A system, comprising:

at least one database of motor data;

a data storage and access module adapted to identify data records in the at least one database;

a motor estimation module adapted to establish estimated values of a plurality of electrical parameters of an electric motor based on electrical input data and cable resistance data; and a result module adapted to output and/or store the estimated values of the plurality of electrical parameters established by the motor estimation module;

wherein the at least one database comprises a motor loss database having power losses correlated with various parameters of the electric motor.

32. A system, comprising:

at least one database of motor data;

a data storage and access module adapted to identify data records in the at least one database;

a motor estimation module adapted to establish estimated values of a plurality of electrical parameters of an electric motor based on electrical input data and cable resistance data; and a result module adapted to output and/or store the estimated values of the plurality of electrical parameters established by the motor estimation module;

wherein the data storage and access module comprises a data population module adapted to populate fields of the motor estimation module with logged data for a desired test of the electric motor.

* * * * *